United States Patent
Nonaka

(10) Patent No.: US 7,532,052 B2
(45) Date of Patent: May 12, 2009

(54) CLOCK DUTY CHANGING APPARATUS

(75) Inventor: Akiko Nonaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/000,858

(22) Filed: Dec. 18, 2007

(65) Prior Publication Data

US 2008/0150601 A1    Jun. 26, 2008

(30) Foreign Application Priority Data

Dec. 26, 2006   (JP)   ............................. 2006-348799

(51) Int. Cl.
*H03K 3/017* (2006.01)
(52) U.S. Cl. ....................... 327/175; 327/172
(58) Field of Classification Search ......... 327/172–176, 327/165, 166
See application file for complete search history.

(56) References Cited

U.S. PATENT DOCUMENTS

| | | | |
|---|---|---|---|
| 6,147,532 A | 11/2000 | Ueda | |
| 6,831,493 B2 * | 12/2004 | Ma | ............................. 327/175 |
| 7,015,739 B2 * | 3/2006 | Lee et al. | ..................... 327/175 |
| 7,199,634 B2 * | 4/2007 | Cho et al. | ..................... 327/175 |
| 7,221,204 B2 * | 5/2007 | Kim et al. | ..................... 327/175 |
| 7,423,465 B2 * | 9/2008 | Gomm | ......................... 327/175 |
| 7,423,467 B1 * | 9/2008 | Simon | ......................... 327/175 |
| 2004/0232967 A1 | 11/2004 | Ishimi | |

FOREIGN PATENT DOCUMENTS

| | | |
|---|---|---|
| JP | 2000-059214 A | 2/2000 |
| JP | 2003-243973 A | 8/2003 |
| JP | 2004-348573 A | 12/2004 |

* cited by examiner

*Primary Examiner*—Lincoln Donovan
*Assistant Examiner*—Hai L. Nguyen
(74) *Attorney, Agent, or Firm*—Foley & Lardner LLP

(57) ABSTRACT

A clock duty changing apparatus changes a duty ratio of an input clock signal with nearly 50% duty ratio to a target value being externally supplied and outputs the input clock signal thereinafter as an output signal. The apparatus includes a duty regulation circuit and a duty correction circuit. The duty regulation circuit includes a delay selection circuit and an operation circuit. The delay selection circuit generates a delay signal by delaying the input clock signal by delay time determined based on a first control signal and a second control signal. The first control signal is externally supplied to the apparatus. The second control signal is generated by the duty correction circuit so that mismatch between the duty ratio of the output clock signal and the target value is reduced. The operation circuit generates the output clock signal by logic operation using the delay signal and the input clock signal.

6 Claims, 33 Drawing Sheets

| VALUE OF S[2:0] | DUTY RATIO |
| --- | --- |
| 0b000 | 45% |
| 0b001 | 40% |
| 0b010 | 35% |
| 0b011 | 30% |
| 0b100 | 55% |
| 0b101 | 60% |
| 0b110 | 65% |
| 0b111 | 70% |

Fig. 2

| VALUE OF S[2:0] | HL_CT |
|---|---|
| 0b000 | 0b0 |
| 0b001 | 0b0 |
| 0b010 | 0b0 |
| 0b011 | 0b0 |
| 0b100 | 0b1 |
| 0b101 | 0b1 |
| 0b110 | 0b1 |
| 0b111 | 0b1 |

Fig. 3

| VALUE OF S[2:0] | Y[1:0] |
|---|---|
| 0b000 | 0b00 |
| 0b001 | 0b01 |
| 0b010 | 0b10 |
| 0b011 | 0b11 |
| 0b100 | 0b00 |
| 0b101 | 0b01 |
| 0b110 | 0b10 |
| 0b111 | 0b11 |

Fig. 4

| HL_CT | OUTPUT FROM SELECTOR 25 |
|---|---|
| 0b1 | CKL |
| 0b0 | CKS |

Fig. 6

| DELAYEN | OUTPUT FROM SELECTOR 26 (PLLD) |
|---|---|
| 0b0 | PLLCK |
| 0b1 | OUTPUT FROM SELECTOR 25 |

Fig. 7

| VALUE OF Y[1:0] | OUTPUT FROM SELECTOR 204 (SHT) |
|---|---|
| 0b00 | PLLDS3 |
| 0b01 | PLLDS2 |
| 0b10 | PLLDS1 |
| 0b11 | PLLDS0 |

| VALUE OF CNTD[2:0] | OUTPUT FROM SELECTOR 2003 (PLLDSO) |
|---|---|
| 0b000 | DS00 |
| 0b001 | DS01 |
| 0b010 | DS02 |
| 0b011 | DS03 |
| 0b100 | DS04 |

Fig. 11

| VALUE OF CNTD[2:0] | OUTPUT FROM SELECTOR 2006 (PLLDSX) |
|---|---|
| 0b000 | DSX0 |
| 0b001 | DSX1 |
| 0b010 | DSX2 |
| 0b011 | DSX3 |
| 0b100 | DSX4 |

Fig. 13

| VALUE OF Y[1:0] | OUTPUT FROM SELECTOR 214 (LNG) |
|---|---|
| 0b00 | PLLDL0 |
| 0b01 | PLLDL1 |
| 0b10 | PLLDL2 |
| 0b11 | PLLDL3 |

| VALUE OF CNTD[2:0] | OUTPUT FROM SELECTOR 2103 (PLLDLX) |
| --- | --- |
| 0b000 | DLX0 |
| 0b001 | DLX1 |
| 0b010 | DLX2 |
| 0b011 | DLX3 |
| 0b100 | DLX4 |

Fig. 17

| VALUE OF HL_CT | OUTPUT FROM SELECTOR 33 (CNTD[2:0]) |
|---|---|
| 0b0 | CNTDS[2:0] |
| 0b1 | CNTDL[2:0] |

| VALUE OF S[2:0] | OUTPUT FROM SELECTOR 418 (CKDIV0) |
|---|---|
| 0b000 | D3 |
| 0b001 | D2 |
| 0b010 | D1 |
| 0b011 | D0 |
| 0b100 | D4 |
| 0b101 | D5 |
| 0b110 | D6 |
| 0b111 | D7 |

Fig. 23

CLOCK DUTY CHANGING APPARATUS

BACKGROUND OF THE INVENTION

1. Field of the Invention

The present invention relates to a clock duty changing apparatus for regulating the duty ratio of the input clock signal having a duty ratio regulated to about 50% to a desired value.

2. Description of Related Art

A PLL (Phase Locked Loop) circuit disclosed in Japanese Unexamined Patent Application Publication No. 2000-59214 (hereinbelow, called patent document 1) includes a Voltage Controlled Oscillator (VCO) that includes an odd number of stages of inverters inside thereof. The VCO in the patent document 1 further includes a delay circuit connected between inverters forming the VCO and a delay control circuit controlling a delay time of the delay circuit in response to an external command. The PLL circuit disclosed in the patent document 1 changes the delay time of the delay circuit according to the external command to change duty ratio of the clock signal generated by the VCO.

Japanese Unexamined Patent Application Publication No. 2004-348573 (hereinbelow, called patent document 2) discloses a clock generation circuit including a PLL circuit and a delay circuit connected to an output of the PLL circuit. The clock generation circuit disclosed in the patent document 2 is able to change duty ratio of a clock signal output from the PLL by employing a delay signal generated by delaying the clock signal output from the PLL circuit as a control signal. Further, the patent document 2 discloses regulating delay amount of the delay circuit included in the clock generation circuit to a desired duty ratio by controlling the delay amount in multiple stages using a multi-value delay control signal.

Further, Japanese Unexamined Patent Application Publication No. 2003-243973 (hereinbelow, called patent document 3) discloses a duty regulation circuit for making the duty ratio of the clock signal whose duty ratio is not 50% close to 50%. To be more specific, the duty regulation circuit disclosed in the patent document 3 employs the delay signal generated by delaying the input clock signal by a delay line as the control signal in order to change the duty ratio of the input clock signal. Further, the duty regulation circuit disclosed in the patent document 3 detects whether the duty ratio of the output clock signal whose duty ratio is regulated is the desired duty ratio of 50%. The duty regulation circuit disclosed in the patent document 3 changes the delay amount of the delay line according to the detection result to regulate the duty ratio of the output clock signal. However, the duty regulation circuit disclosed in the patent document 3 does not change the duty ratio of the input clock signal to the value other than 50%. Further, the duty regulation circuit disclosed in the patent document 3 is not configured to change the delay amount of the delay line according to the control signal from an external device.

I have now discovered that there are problems as follows in the techniques disclosed in the patent documents 1 and 2. In the technique disclosed in the patent document 1, which is the technique connecting the delay circuit to the VCO included in the PLL circuit to change the duty ratio of the clock signal in response to the external command, is only effective when the VCO is configured by the odd number of stages of inverters. Moreover, the delay circuit for changing the duty ratio is provided inside the PLL circuit, which requires modifying a core in order to apply this technique to the PLL (PLL core) which is produced as an IP core. Further, when the PLL core is formed as black box, it is difficult to change the duty ratio of the clock signal generated by the PLL by employing the technique disclosed in the patent document 1.

In the clock generation circuit disclosed in the patent document 2, the circuit including the delay circuit is connected to the output of the PLL circuit and regulates the duty ratio of the clock signal generated by the PLL circuit. However, even when the regulation is carried out to obtain the clock signal having the desired duty ratio by the control signal from the external device, the duty ratio of the clock signal that is actually output may not be the desired duty ratio due to tolerance in a production process of the delay circuit or the like. The patent document 2 does not disclose the technique for attaining the desired duty ratio by compensating the fluctuation of the duty ratio due to the production tolerance or the like.

SUMMARY

A clock duty changing apparatus according to a first aspect of the present invention changes a duty ratio of an input clock signal with nearly 50% duty ratio to a target value being externally supplied and outputs the input clock signal thereinafter as an output signal. The apparatus includes a duty regulation circuit, a duty comparison circuit, and a duty correction circuit. The duty regulation circuit includes a delay selection circuit and an operation circuit. The delay selection circuit generates a delay signal generated by delaying the input clock signal by delay time determined based on a first control signal and second control signal. The first control signal is externally supplied to the apparatus. The second control signal is generated in the apparatus. The operation circuit generates the output clock signal by a logic operation using the delay signal and the input clock signal. The duty comparison circuit determines whether or not the duty ratio of the output clock signal matches the target value. The duty correction circuit generates the second control signal indicating a correction amount of the delay time given to the delay signal depending on the determination result made by the duty comparison circuit so that mismatch between the duty ratio of the output clock signal and the target value is reduced.

The clock duty changing apparatus according to the first aspect of the present invention is formed as the circuit separated from the clock generation circuit such as the PLL circuit or the like. The clock duty changing apparatus according to the first aspect of the present invention is connected to an output means of the PLL circuit or the like, which makes it possible to regulate the duty ratio of the clock signal output from the PLL circuit or the like to the desired value. Therefore, the clock duty changing apparatus according to the first aspect of the present invention is widely applicable regardless of the configuration of the PLL circuit.

Further, in the clock duty changing apparatus according to the first aspect of the present invention, the delay time of the delay signal generated by the delay selection circuit in the duty regulation circuit can be changed so that the duty comparison circuit refers to the duty ratio of the output clock signal and the duty ratio of the output clock signal becomes the desired duty ratio. Therefore, it is possible to compensate the deviation of the duty ratio of the output clock signal due to the production tolerance of the circuit and to reduce the mismatch between the duty ratio of the output clock signal and the target value of the duty ratio designated by the external device by the first control signal.

The present invention provides a clock duty changing apparatus that is generally applicable regardless of the configuration of the clock generation circuit such as PLL circuit or the like and compensating deviation of the duty ratio of the output clock signal caused by the production tolerance.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 2 is a diagram showing a correspondence relationship between control signal S[2:0] and target value of duty ratio;

FIG. 3 is a chart showing a correspondence relationship between control signal S[2:0] and control signal HL_CT;

FIG. 4 is a chart showing a correspondence relationship between control signal S[2:0] and control signal Y[1:0];

FIG. 6 is a chart showing a selection logic of a selector 25;

FIG. 7 is a chart showing the selection logic of a selector 26;

FIG. 11 is a chart showing the selection logic of a selector 2003;

FIG. 13 is a chart showing the selection logic of a selector 2006;

FIG. 17 is a chart showing the selection logic of a selector 2103;

FIG. 23 is a chart showing the selection logic of a selector 418;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Hereinafter, the specific embodiment to which the present invention is applied will be described in detail with reference to the drawings. The same reference symbols are given to the same components in each drawing, and the overlapping description is omitted as appropriate for the sake of clarity.

First Embodiment

Figure 1:
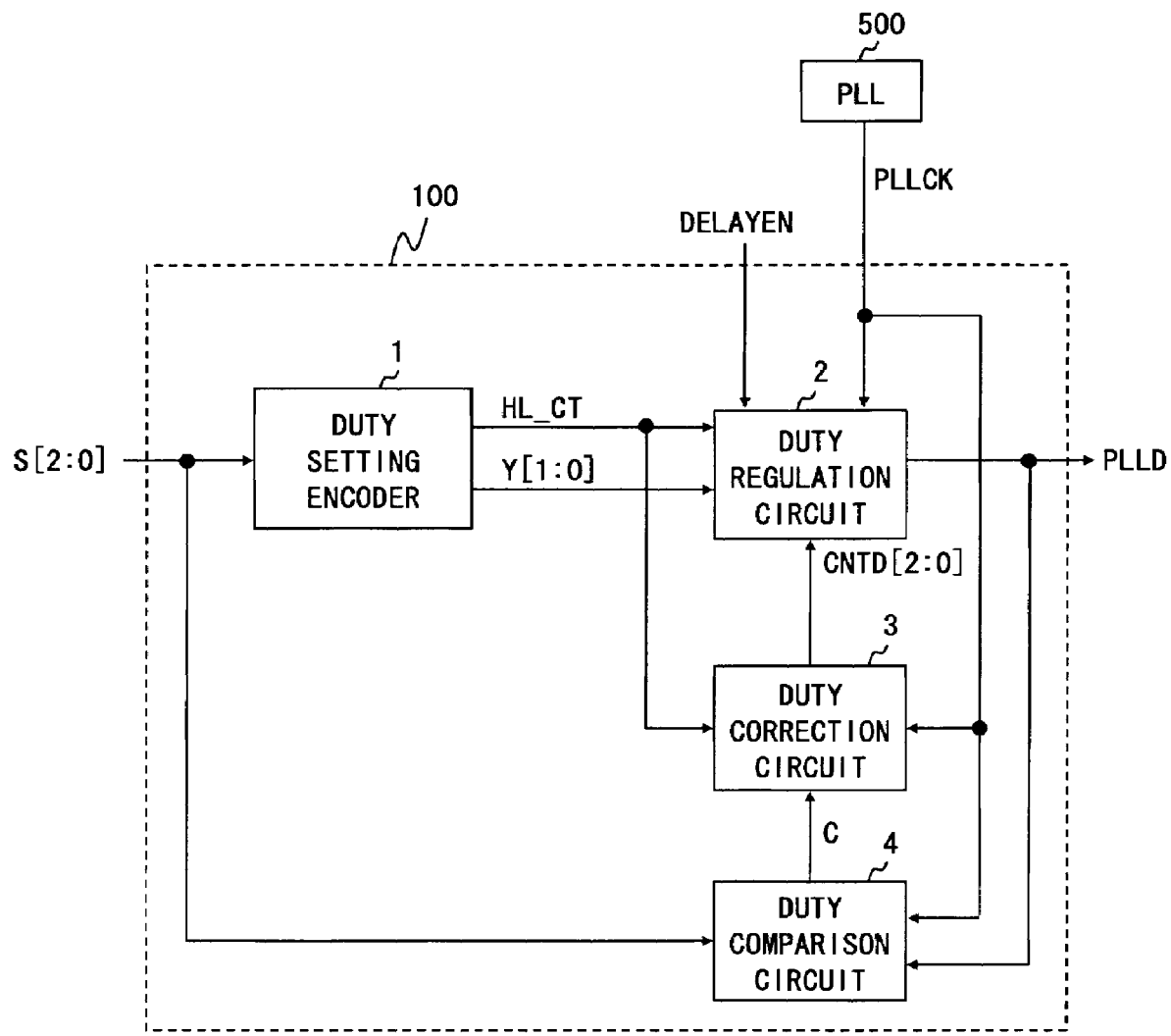
FIG. 1 is a configuration diagram of a clock duty changing apparatus according to a first embodiment of the invention.

FIG. 1 shows a configuration of a clock duty changing apparatus 100 according to the first embodiment. The clock duty changing apparatus 100 changes a duty ratio of a clock signal PLLCK input from an external PLL circuit 500 and having a duty ratio regulated to about 50% to the value designated by control signal S[2:0] (a first control signal) input from an external device so as to output clock signal PLLD whose duty ratio is changed.

In FIG. 1, a duty setting encoder 1 encodes 3-bit control signal S[2:0] input from the external device to generate 1-bit control signal HL_CT and 2-bit control signal Y[1:0]. Note that the control signal S[2:0] is the signal to externally notify the clock duty changing apparatus 100 of target value of the duty ratio of output clock signal PLLD.

The correspondence relationship between the value of control signal S[2:0] and the target value of the duty ratio of output clock signal PLLD is not fixed. One example thereof is shown in FIG. 2. In the first embodiment, the control signal S[2:0] is 3-bit signal. Therefore, it is possible to set up to eight stages of target values of the duty ratio. In the example shown in FIG. 2, the control signal S[2:0] of "0b000" corresponds to duty ratio of 45%. The duty ratio becomes larger by 5% as the value of the control signal S[2:0] increases by one. The control signal S[2:0] of "0b111" corresponds to duty ratio of 70%. Note that prefix "0b" means binary digit in this specification. To be more specific, when the value of the control signal S[2:0] is 0b000, 0b001, 0b010, and 0b011, a High level period of the output clock signal PLLD is decreased to 45%, 40%, 35%, and 30%, respectively. On the other hand, when the value of the control signal S[2:0] is 0b100, 0b101, 0b110, and 0b111, the High level period of the output clock signal PLLD is increased to 55%, 60%, 65%, and 70%, respectively.

One example of the correspondence relationship between two control signals HL_CT and Y[1:0] generated by the duty setting encoder 1 and control signal S[2:0] will be shown in FIGS. 3 and 4, respectively. In the examples shown in FIGS. 3 and 4, a top bit of the control signal S[2:0] is called control signal HL_CT, and lower two bit of control signal S[2:0] is called control signal Y[1:0]. In summary, if the value of control signal HL_CT is 1, it means duty ratio increases (larger than 50%), and if the value of control signal HL_CT is 0, it means duty ratio decreases (smaller than 50%). The value of the control signal Y[1:0] indicates a degree of increasing in the duty ratio (+5% to +20%) or a degree of decreasing in the duty ratio (−5% to −20%) from duty ratio 50%.

In the first embodiment, the control signal S[2:0] is 3-bit signal and designates the eight different kinds of duty ratios shown in FIG. 2. However, the value and the number of the duty ratio regulated by the clock duty changing apparatus 100 can be any. Further, a bit width of the control signal S[2:0] can be determined according to the number of regulation of the duty ratio.

The duty regulation circuit 2 shown in FIG. 1 regulates the duty ratio of the input clock signal PLLCK based on the duty ratio designated by the control signal S[2:0] to output the signal whose duty ratio is regulated as the output clock signal PLLD. To be more specific, an enable signal DELAYEN input from the external device and the input clock signal PLLCK are input to the duty regulation circuit 2. The enable signal DELAYEN is the signal designating beginning and end of the duty ratio regulation. For example, the enable signal DELAYEN maybe 1-bit logic signal. The control signals HL_CT and Y[1:0] are input to the duty regulation circuit 2 from the duty setting encoder 1 and control signal CNTD[2:0] (a second control signal) is input to the duty regulation circuit 2 from the duty correction circuit 3. The control signal CNTD[2:0] generated by the duty correction circuit 3 is the signal designating the degree of mismatch between the target value of the duty ratio designated by control signal S[2:0] and the duty ratio of the output clock signal PLLD. In other words, the control signal CNTD[2:0] is the signal controlling the delay amount of the delay circuit included in the duty regulation circuit 2. The duty regulation circuit 2 changes the duty ratio of the input clock signal PLLCK according to the control signals HL_CT (a third control signal) and Y[1:0] (a fourth control signal) to output the clock signal PLLD and fine-tunes the duty ratio of the output clock signal PLLD according to the control signal CNTD[2:0].

The duty correction circuit 3 determines the value of the control signal CNTD[2:0] so that the mismatch between the duty ratio of the output clock signal PLLD and the target value of the duty ratio designated by the control signal S[2:0] becomes small according to control signal C output from a duty comparison circuit 4.

The duty comparison circuit 4 determines whether the duty ratio of the output clock signal PLLD matches the target value designated by S[2:0] to output the determination result as control signal C.

Figure 5:
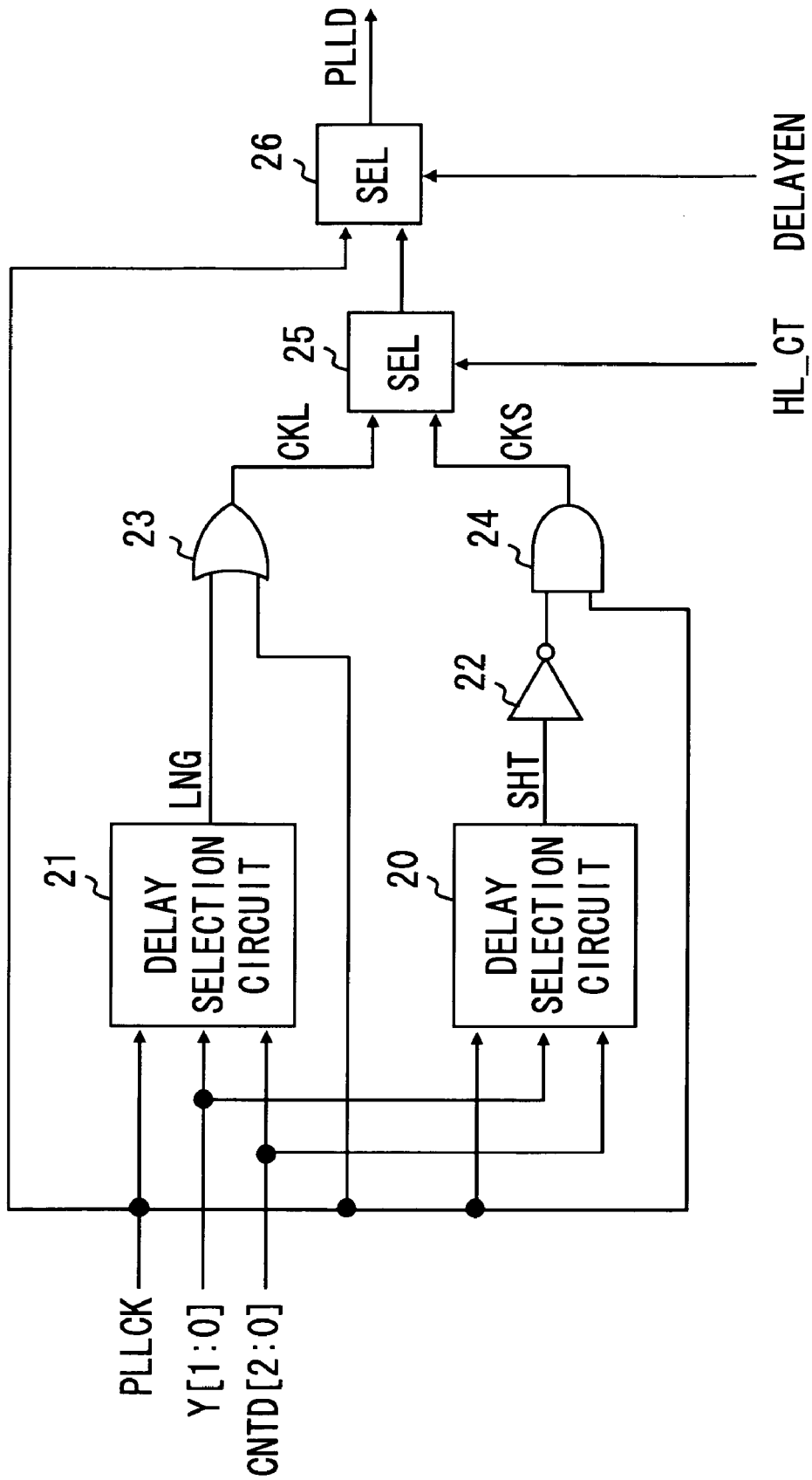
FIG. 5 is a configuration diagram of a duty regulation circuit included in the clock duty changing apparatus according to the first embodiment of the invention.

Hereinafter, the duty regulation circuit 2, the duty correction circuit 3, and the duty comparison circuit 4 will be described in detail with reference to specific configuration examples. A configuration example of the duty regulation circuit 2 is shown in FIG. 5. In FIG. 5, the delay selection circuits 20 and 21 are the circuits delaying the input clock signal PLLCK to output the delayed input clock signal PLLCK. The delay amount given to the input clock signal PLLCK by the delay selection circuits 20 and 21 is determined based on control signals Y[1:0] and CNTD[2:0].

An OR circuit 23 receives a clock signal LNG that is delayed by the delay selection circuit 21 and the original input clock signal PLLCK, and outputs logical OR operation result therebetween. The clock signal CKL output from the OR circuit 23 has the same frequency as that of the input clock signal PLLCK and is the signal in which the High level period or the duty ratio of the input clock signal PLLCK is increased.

An AND circuit 24 receives the signal generated by inverting the clock signal SHT delayed by the delay selection circuit 20 using an inverter 22 and the original input clock signal PLLCK, and outputs logical AND operation result therebetween. The clock signal CKS output from the AND circuit 24 has the same frequency as that of the input clock signal PLLCK and is the signal in which the High level period or the duty ratio of the input clock signal PLLCK is decreased.

A selector 25 selects one of the clock signal CKL output from the OR circuit 23 and the clock signal CKS output from the AND circuit 24 according to the control signal HL_CT to output the selected signal. The selection logic of the selector 25 is shown in FIG. 6. In summary, the selector 25 selects the clock signal CKL when the value of the control signal HL_CT is 1 and selects the clock signal CKS when the value of the control signal HL_CT is 0.

A selector 26 selects one of the output signal of the selector 25 and the input clock signal PLLCK according to the enable signal DELAYEN to output the selected signal as output clock signal PLLD. The selection logic of the selector 26 is shown in FIG. 7. In summary, the selector 26 selects the output signal of the selector 25 (clock signal CKL or CKS whose duty ratio is changed) when the value of the enable signal DELAYEN is 1. On the other hand, when the value of the enable signal DELAYEN is 0, it is determined that the duty ratio is not changed. Then the selector 26 selects and outputs the input clock signal PLLCK.

Figures 8, 9:
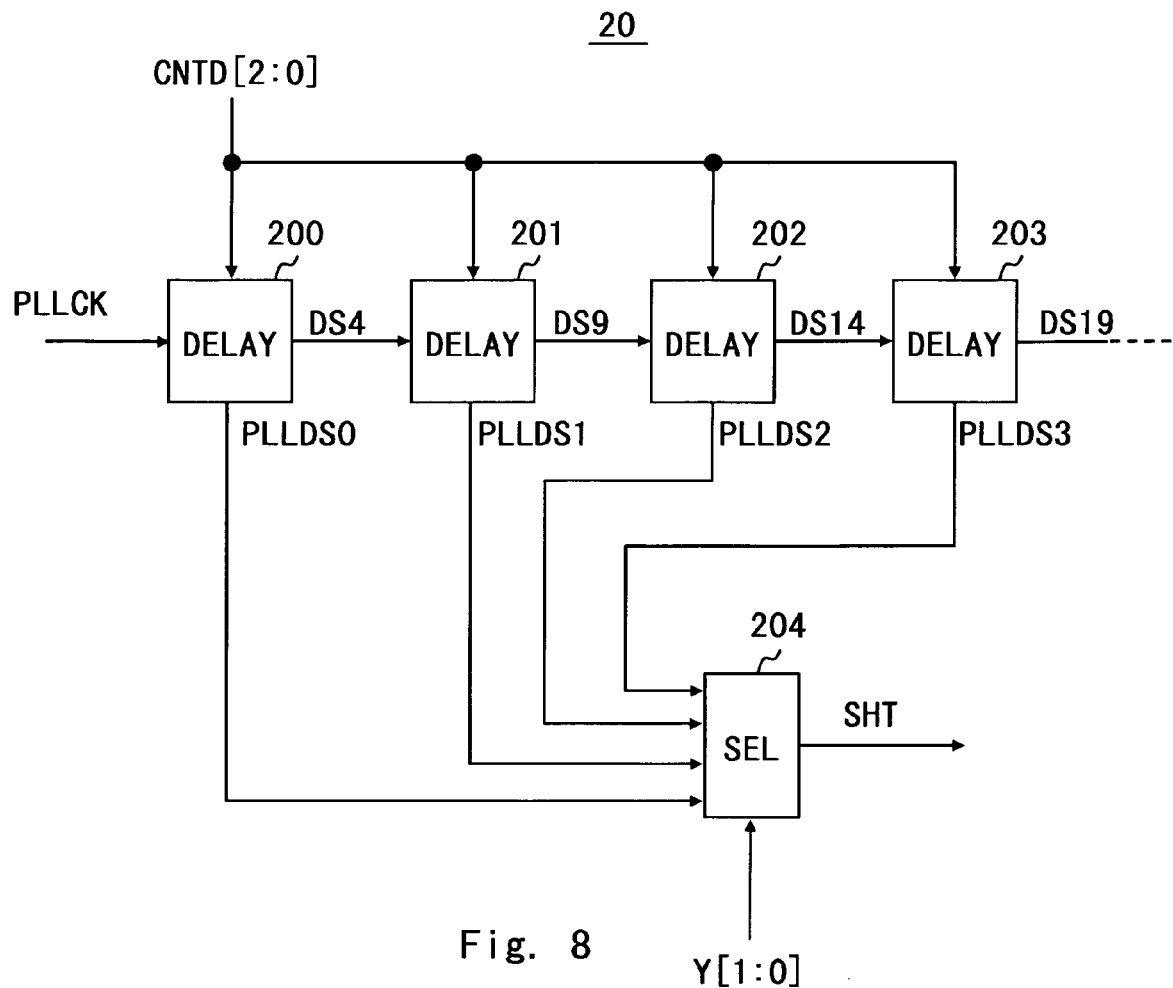
FIG. 8 is a configuration diagram of a delay selection circuit included in the clock duty changing apparatus according to the first embodiment of the invention.
FIG. 9 is a chart showing the selection logic of a selector 204.

Now, a configuration example of the delay selection circuit 20 shown in FIG. 5 is shown in FIG. 8. The delay selection circuit 20 shown in FIG. 5 includes four delay circuits 200 to 203 that are connected in series to each other. The delay amounts of the delay circuits 200 to 203 can be changed according to the control signal CNTD[2:0]. For example, the input clock signal PLLCK is input to the delay circuit 200, and the delay circuit 200 outputs the signal PLLDS0 in which signal PLLCK is delayed by the delay amount designated by the control signal CNTD[2:0]. As in the delay circuit 200, the delay circuits 201 to 203 output the signals PLLDS1 to PLLDS3 in which input signals are delayed.

The selector 204 selects one of the four clock signals PLLDS0 to PLLDS3 having different delay amounts among the delay circuits 200 to 203 according to the control signal Y[1:0] to output the selected signal as the delay clock signal SHT. The selection logic of the selector 204 is shown in FIG. 9. Specifically, when the value of the control signal Y[1:0] is 0b00, the signal PLLDS3 whose delay amount is the largest among the four input signals is selected. On the other hand, when the value of the control signal Y[1:0] is 0b11, the signal PLLDS0 whose delay amount is the smallest among the four input signals is selected.

Figure 10:
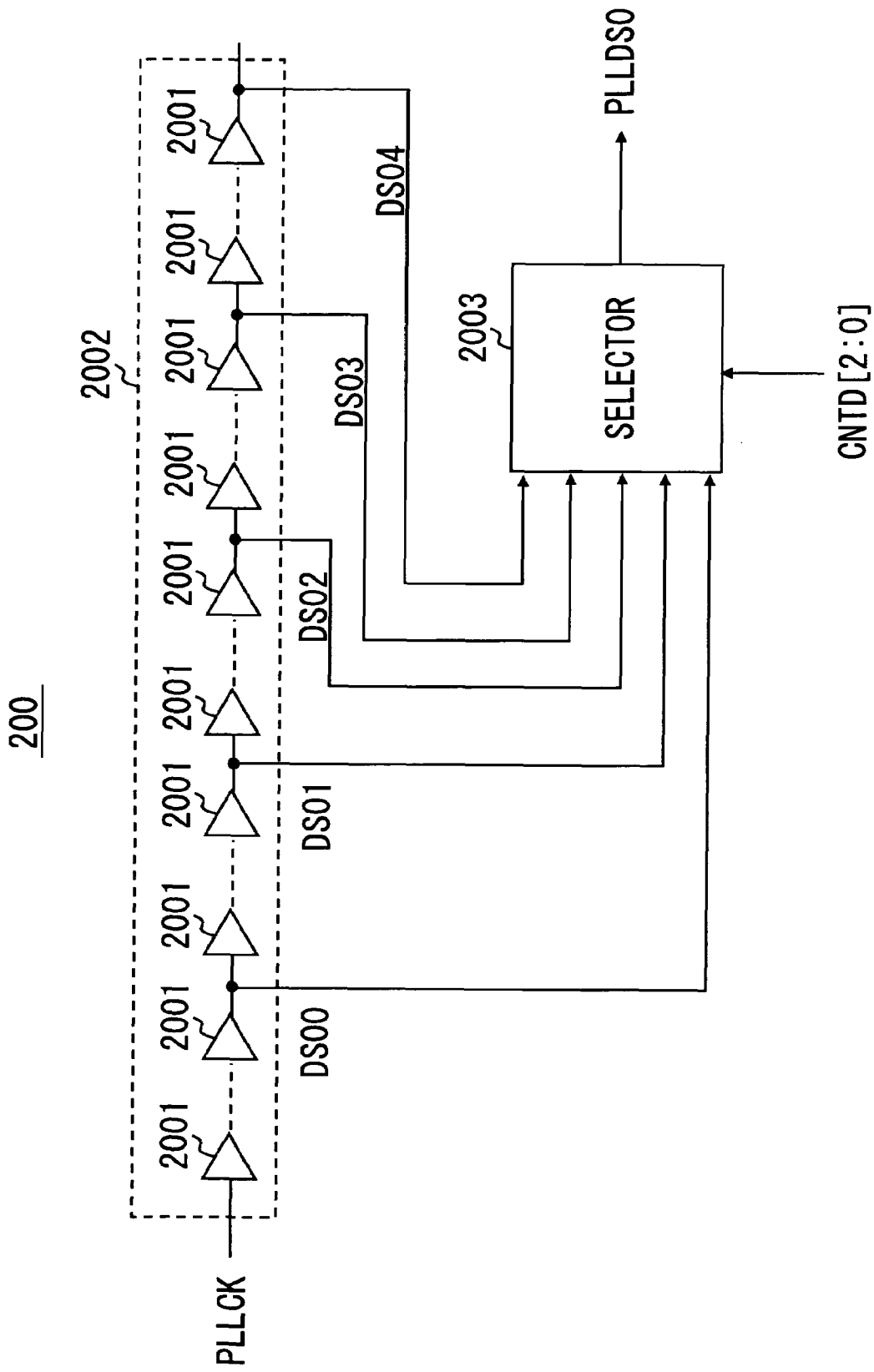
FIG. 10 is a configuration diagram of a delay circuit included in the delay selection circuit.

A configuration example of the delay circuit 200 included in the delay selection circuit 20 shown in FIG. 8 is shown in FIG. 10. The delay circuit 200 generates the delay signal PLLDS0 in which the input clock signal PLLCK is delayed in order to make the duty ratio of the input clock signal PLLCK smaller than 50%. The delay circuit 200 in FIG. 10 includes a delay line 2002 having a plurality of buffers 2001 connected in series. A selector 2003 selects one of the delay signals DS00 to DS04 distributed from five different areas of the delay line 2002 according to the control signal CNTD[2:0] to output the selected delay signal as the delay signal PLLDS0.

The duty ratio designated by the control signal S[2:0] is called DUS %, a period of the clock signal PLLCK is called $P_{PER}$, a time passing through the inverter 22 shown in FIG. 5 is called TH0, and the time passing through the selector 204 shown in FIG. 8 is called TH5. Then the delay time ΔPLLDS0 of the delay signal PLLDS0 to the input clock signal PLLCK needs to satisfy the value shown in expression (1) below.

$$\Delta PLLDS0 = P_{PER} * DUS/100 - TH0 - TH5 \quad (1)$$

However, due to tolerance in a production process, deviation may be occurred in ΔPLLDS0 of the clock duty changing apparatus 100. If there is a mismatch between the value of ΔPLLDS0 and the desired value shown in the expression (1), then the duty ratio of the output clock signal PLLD become different from the target value of the duty ratio designated by the control signal S[2:0]. In order to reduce such a deviation of the duty ratio of the output clock signal PLLD caused by the production tolerance, the delay circuit 200 can change the delay time given to the delay signal PLLDS0 in a plurality of different ways, for example five different ways in the specific example below.

For example, when the value of the control signal S[2:0] is 0b011, the target value of the duty ratio is 30%, as shown in FIG. 2. In this case, the delay signal PLLDS0 is needed as the output of the delay selection circuit 20 as shown in FIGS. 4, 8, and 9. Then, in order to reduce the deviation of the delay signal PLLDS0 due to the production tolerance, the delay circuit 200 shown in FIG. 10 is able to output five different delay signals PLLDS0 having different delay times as shown in expressions (2) to (6) below.

$$\Delta PLLDS0\_0 = P_{PER}*30/100 - TH0 - TH5 - \alpha0 = \Delta DS00 + TH6 \quad (2)$$

$$\Delta PLLDS0\_1 = P_{PER}*30/100 - TH0 - TH5 - \alpha1 = \Delta DS01 + TH6 \quad (3)$$

$$\Delta PLLDS0\_2 = P_{PER}*30/100 - TH0 - TH5 = \Delta DS02 + TH6 \quad (4)$$

$$\Delta PLLDS0\_3 = P_{PER}*30/100 - TH0 - TH5 + \alpha2 = \Delta DS03 + TH6 \quad (5)$$

$$\Delta PLLDS0\_4 = P_{PER}*30/100 - TH0 - TH5 + \alpha3 = \Delta DS04 + TH6 \quad (6)$$

In the expressions (2) to (6), TH6 shows the time passing through the selector 2003. ΔDS00 to ΔDS04 shows the delay times of the delay signals DS00 to DS04 to the input clock signal PLLCK, respectively. α0 to α3 can be any value. The configuration of the delay circuit 200 shown in FIG. 10 is only an example. For example, the number of delay times ΔPLLDS0 is not limited to five. The bit width of the control signal CNTD[2:0] generated by the duty correction circuit 3 can be determined according to the number of delay times in the delay circuits 200 to 203.

Figure 12:
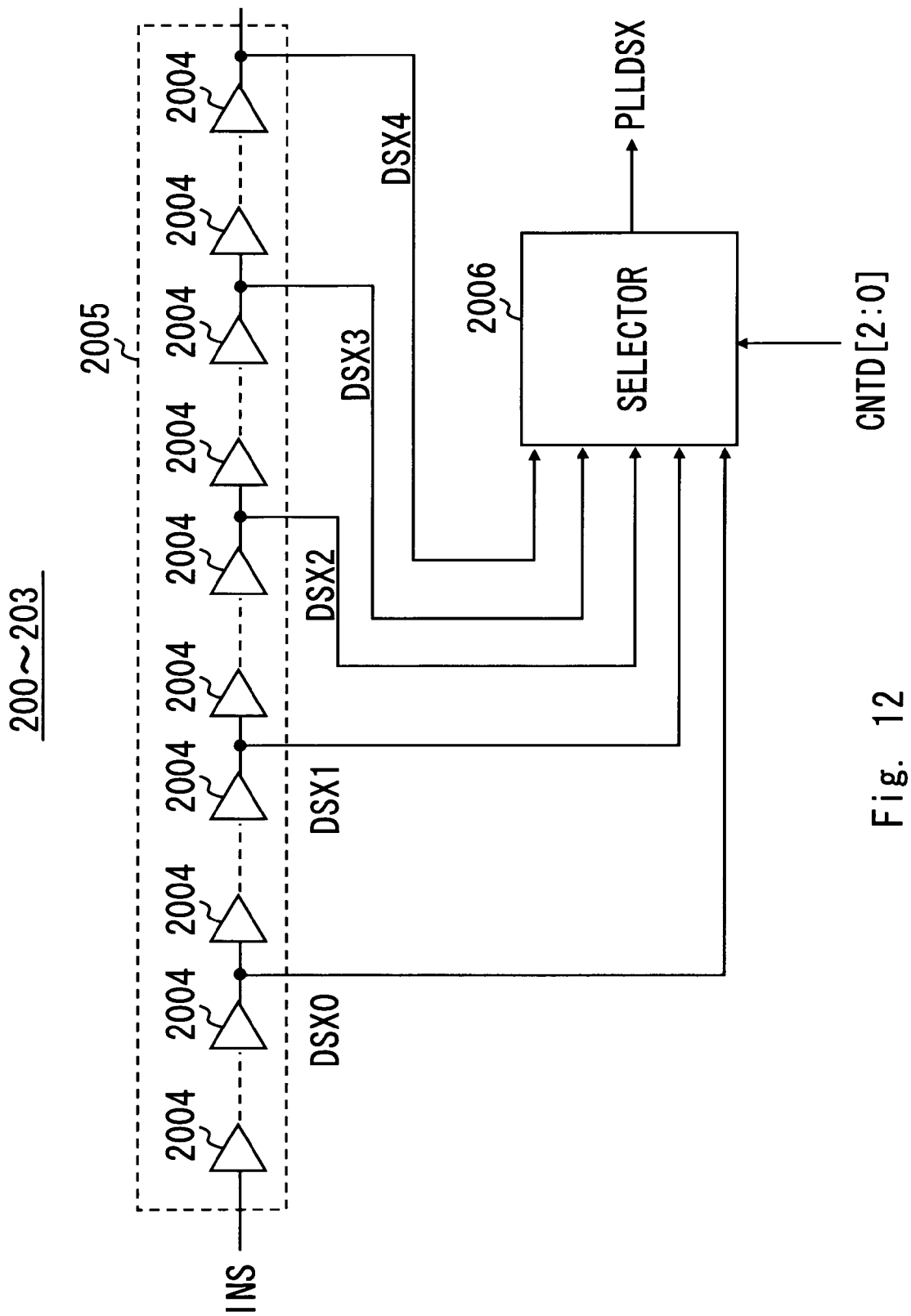
FIG. 12 is a configuration diagram of the delay circuit included in the delay selection circuit.

The configuration of the delay circuits 201 to 203 included in the delay selection circuit 20 shown in FIG. 8 can be the same as the configuration of the delay circuit 200 shown in FIG. 10. The generalized configuration of the delay circuits 200 to 203 is shown in FIG. 12. The delay circuit shown in FIG. 12 has a delay line 2005 having a plurality of buffers 2004 connected in series. A selector 2006 selects one of the delay signals dsX0 to dsX4 distributed from five different areas of the delay line 2005 according to the control signal CNTD[2:0] to output the selected delay signal as the delay signal PLLDSX. Therefore, the delay circuit shown in FIG. 12 is able to output the delay signal PLLDSX having five different delay times as shown in the expressions (7) to (11) below.

$$\Delta PLLDSX\_0 = P_{PER}*DUS/100 - TH0 - TH5 - \alpha0 = \Delta DSX0 + TH7 \quad (7)$$

$$\Delta PLLDSX\_1 = P_{PER}*DUS/100 - TH0 - TH5 - \alpha1 = \Delta DSX1 + TH7 \quad (8)$$

$$\Delta PLLDSX\_2 = P_{PER}*DUS/100 - TH0 - TH5 = \Delta DSX2 + TH7 \quad (9)$$

$$\Delta PLLDSX\_3 = P_{PER}*DUS/100 - TH0 - TH5 + \alpha2 = \Delta DSX3 + TH7 \quad (10)$$

$$\Delta PLLDSX\_4 = P_{PER}*DUS/100 - TH0 - TH5 + \alpha3 = \Delta DSX4 + TH7 \quad (11)$$

Note that DUS (%) is the duty ratio smaller than 50% designated by the control signal S[2:0]. TH7 is the time passing through the selector 2006. Each of ΔDSX0 to ΔDSX4 is the delay times of the delay signals dsX0 to dsX4 to the input signal INS. The selection logic of the selector 2006 based on the control signal CNTD[2:0] is shown in FIG. 13.

Figures 14, 15:
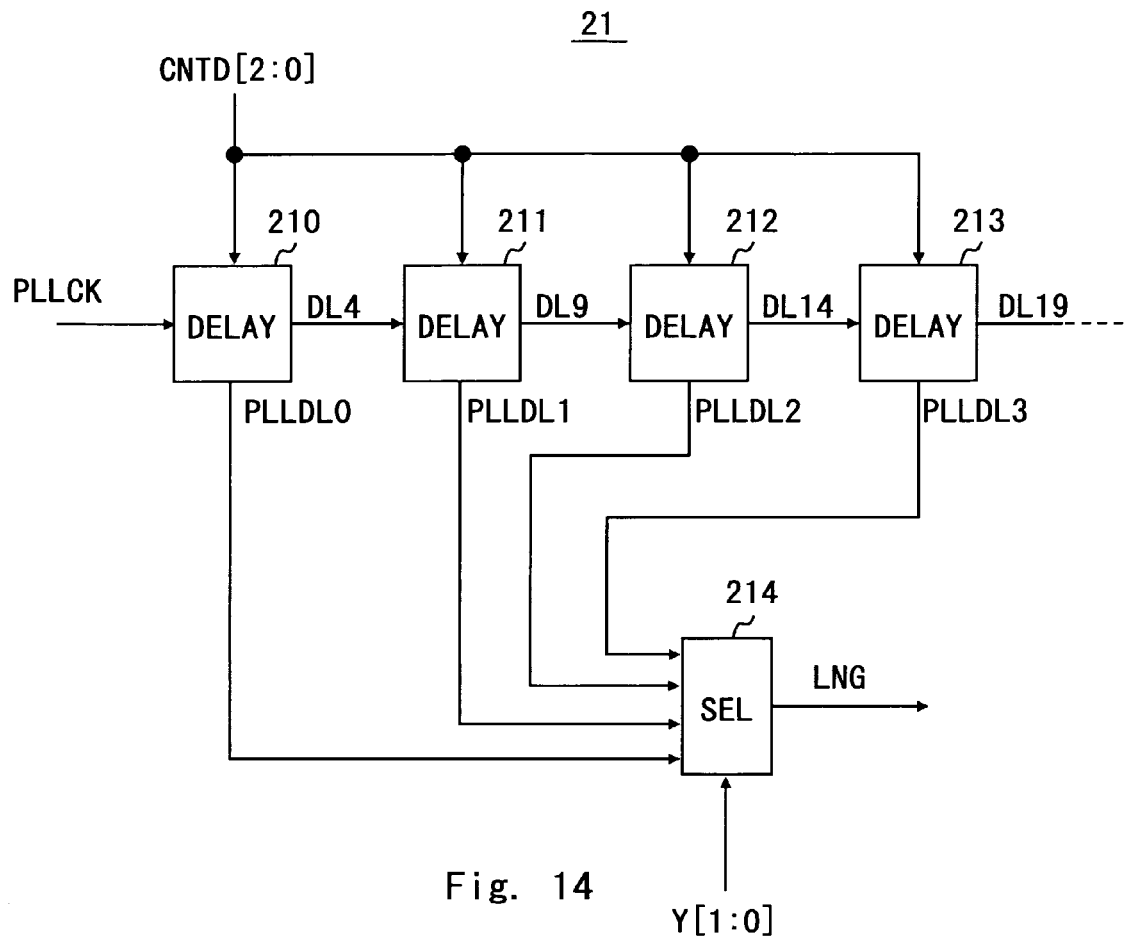
FIG. 14 is a configuration diagram of the delay selection circuit included in the clock duty changing apparatus according to the first embodiment of the invention.
FIG. 15 is a chart showing the selection logic of a selector 214.

Now, a configuration example of the delay selection circuit 21 included in the duty regulation circuit 2 shown in FIG. 5 is shown in FIG. 14. The configuration of FIG. 14 is the same as the configuration of the delay selection circuit 20 shown in FIG. 8. Therefore, the overlapping description will be omitted here. The selector 214 selects one of the four different clock signals PLLDL0 to PLLDL3 having different delay amounts among the delay circuits 210 to 213 according to the control signal Y[1:0] to output the selected signal as the delay clock signal LNG. The selection logic of the selector 214 is shown in FIG. 15.

Figure 16:
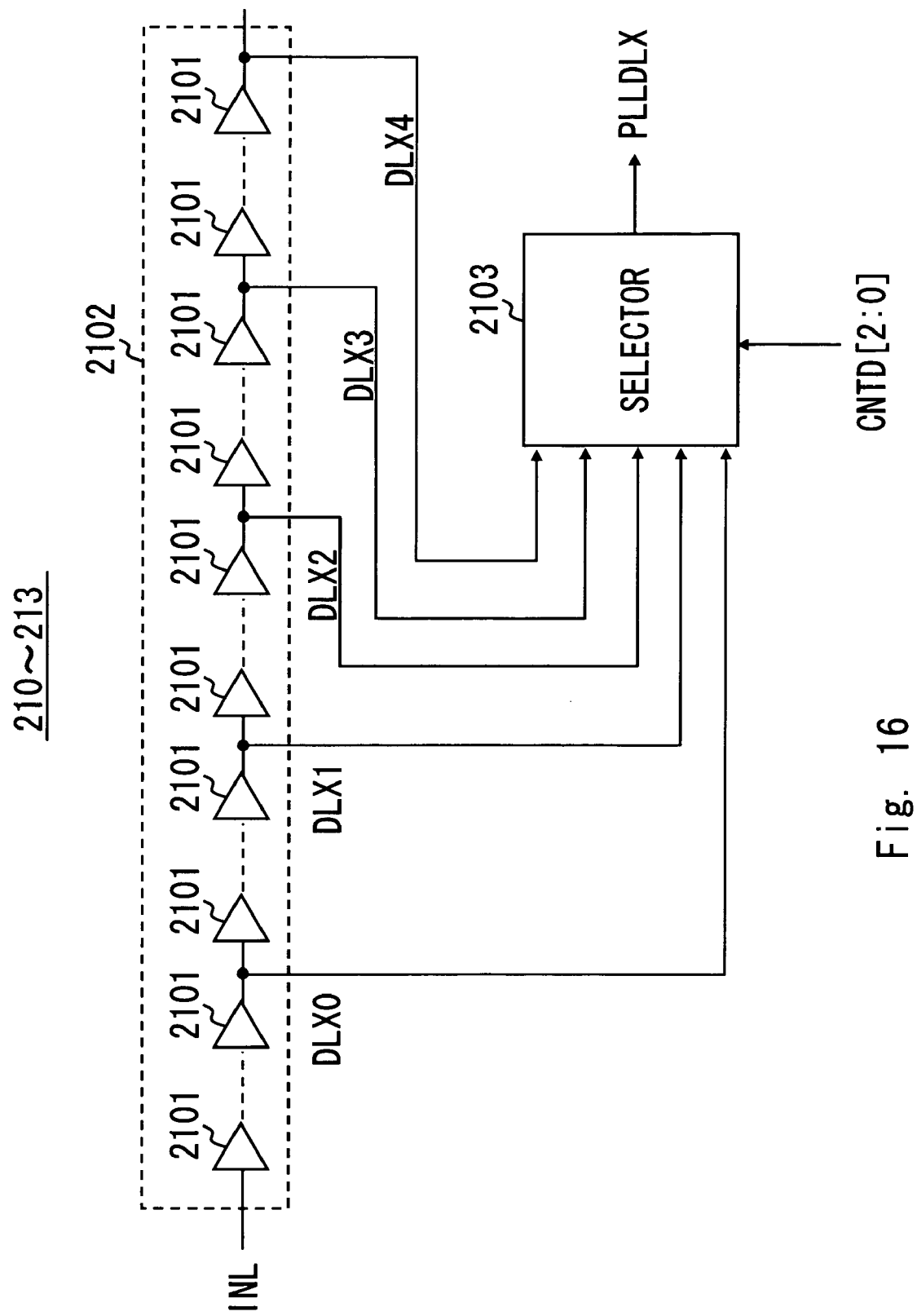
FIG. 16 is a configuration diagram of the delay circuit included in the delay selection circuit.

FIG. 16 is a generalized configuration of the delay circuits 210 to 213 included in the delay selection circuit 21 shown in FIG. 14 in the same way as in FIG. 12. The delay circuit in FIG. 16 generates the five different delay signals DLX0 to DLX4 by delaying the input signal inl by the delay line 2102 having buffers 2101 connected in series. A selector 2103 selects one of the delay signals DLX0 to DLX4 distributed from five different areas in the delay line 2102 according to the control signal CNTD[2:0] to output the selected delay signal as the delay signal PLLDLX. Therefore, the delay circuit shown in FIG. 16 is able to output the delay signals PLLDLX having five different delay times as shown in expressions (12) to (16) below.

$$\Delta PLLDLX\_0 = P_{PER}*(dul-50)/100 - TH8 - \beta0 = \Delta DLX0 + th9 \quad (12)$$

$$\Delta PLLDLX\_1 = P_{PER}*(dul-50)/100 - TH8 - \beta1 = \Delta DLX1 + th9 \quad (13)$$

$$\Delta PLLDLX\_2 = P_{PER}*(dul-50)/100 - TH8 = \Delta DLX2 + th9 \quad (14)$$

$$\Delta PLLDLX\_3 = P_{PER}*(dul-50)/100 - TH8 + \beta2 = \Delta DLX3 + th9 \quad (15)$$

$$\Delta PLLDLX\_4 = P_{PER}*(dul-50)/100 - TH8 + \beta3 = \Delta DLX4 + th9 \quad (16)$$

Note that DUL (%) is the duty ratio larger than 50% designated by the control signal S[2:0]. β0 to β3 can be any value. TH8 is the time passing through the selector 214 in FIG. 14. th9 is the time passing through the selector 2103 in FIG. 16. Each of ΔDLX0 to ΔDLX4 is the delay time of the delay signals DLX0 to DLX4 to the input signal inl. The selection logic based on the control signal CNTD[2:0] of the selector 2103 is shown in FIG. 17.

Figures 18, 19:
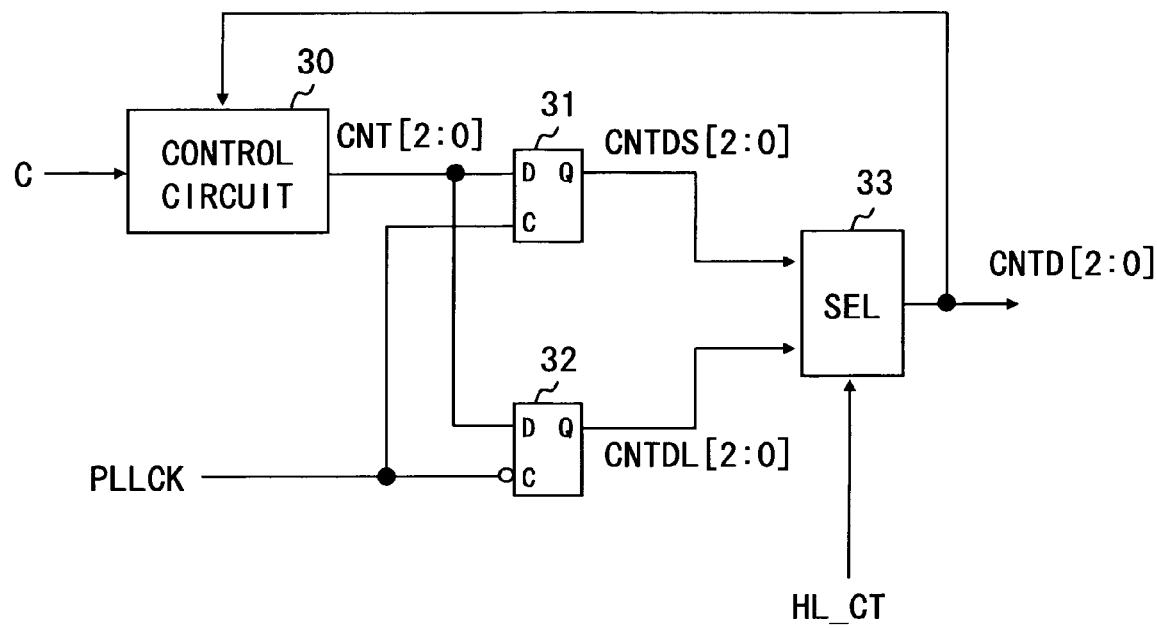
FIG. 18 is a configuration diagram of a duty correction circuit included in the clock duty changing apparatus according to the first embodiment of the invention.
FIG. 19 is a chart showing the selection logic of a selector 33.

Now, a configuration example of the duty correction circuit 3 will be shown in FIG. 18. In FIG. 18, the control circuit 30 generates the signal CNT[2:0] for each one period $P_{PER}$ of the input clock signal PLLCK based on the control signal C output from the duty comparison circuit 4 and the output signal CNTD[2:0]. A flip flop 31 latches the signal CNT[2:0] output from the control circuit 30 at the rising edge of the input clock signal PLLCK to output the latched signal. On the other hand, a flip flop 32 latches the signal CNT[2:0] output from the control circuit 30 at the falling edge of the input clock signal PLLCK to output the latched signal. The output signal CNTDS[2:0] of the flip flop 31 and the output signal CNTDL[2:0] of the flip flop 32 are input to the selector 33. The selector 33 selects one of the CNTDS[2:0] and CNTDL[2:0] according to the control signal HL_CT to output the selected signal as the control signal CNTD[2:0]. The selection logic of the selector 33 is shown in FIG. 19. Specifically, when the duty ratio designated by the control signal S[2:0] is smaller than 50%, the value of the control signal HL_CT is 0. Therefore, CNTDS[2:0] is selected by the selector 33. On the other hand, when the duty ratio designated by the control signal S[2:0] is larger than 50%, the value of the control signal HL_CT is 1. Therefore, CNTDL[2:0] is selected by the selector 33.

Figure 20:
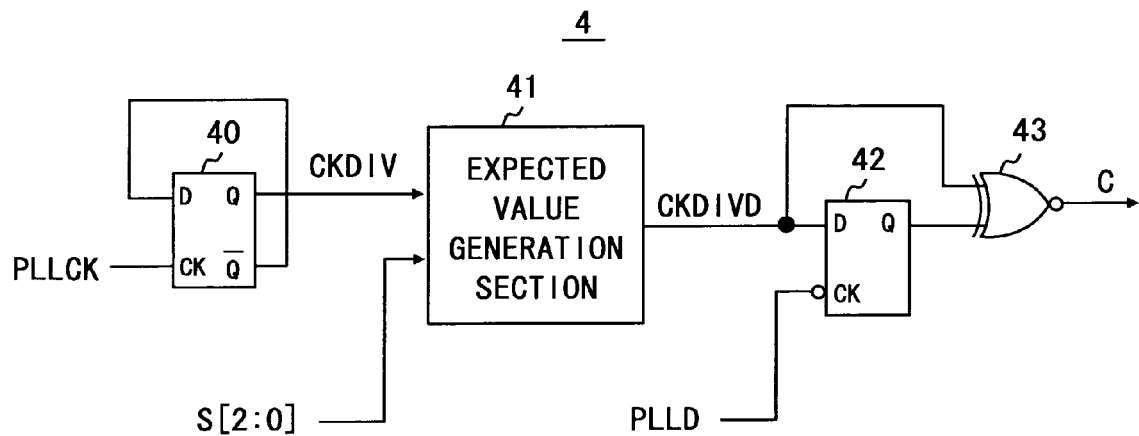
FIG. 20 is a configuration diagram of a duty comparison circuit included in the clock duty changing apparatus according to the first embodiment of the invention.

Now, a configuration example of the duty comparison circuit 4 is shown in FIG. 20. In a D flip flop (DFF) 40, an inverted Q output (QB) is fed back and connected to a D input (D) and the input clock signal PLLCK is input to a clock terminal (CK). The DFF 40 that is thus configured functions as a T flip flop in which the Q output of the DFF 40 is inverted at the rising edge of the input clock signal PLLCK. Therefore, the DFF 40 functions as a frequency divider, and the signal CKDIV output from the Q output of the DFF 40 is the signal in which frequency of the input clock signal PLLCK is divided into two.

An expected value generation section 41 delays the control signal S[2:0] and the signal CKDIV output from the DFF 40 to generate signal CKDIVD. The signal CKDIVD is input to the data input terminal (D) of the DFF 42 from the expected value generation section 41. The output clock signal PLLD of the clock duty changing apparatus 100 is input to the clock terminal (CK) of the DFF 42. The DFF 42 latches the signal CKDIVD at the falling edge of the output clock signal PLLD to output the latched signal to the Q output (Q).

The signal output from the Q output terminal of the DFF 42 and the signal CKDIVD output from the expected value generation section 41 are input to the EXOR circuit 43. The EXOR circuit 43 carries out exclusive OR operation between the two signals. Specifically, the EXOR circuit 43 outputs the signal having a logic level of "1" when the logic values of the signal output from the Q output terminal of the DFF 42 and the signal CKDIVD output from the expected value generation section 41 match, and outputs the signal having the logic level of "0" when the logic values do not match with each other. Therefore, it is possible to determine whether the output clock signal PLLD is regulated to the desired duty ratio designated by the control signal S[2:0]. Specifically, it is determined that the output clock signal PLLD is regulated to the desired duty ratio if the output from the EXOR circuit 43 is 1. On the other hand, it is determined that the output clock signal PLLD is not regulated to the desired duty ratio if the output from the EXOR circuit 43 is 0.

Figure 21:
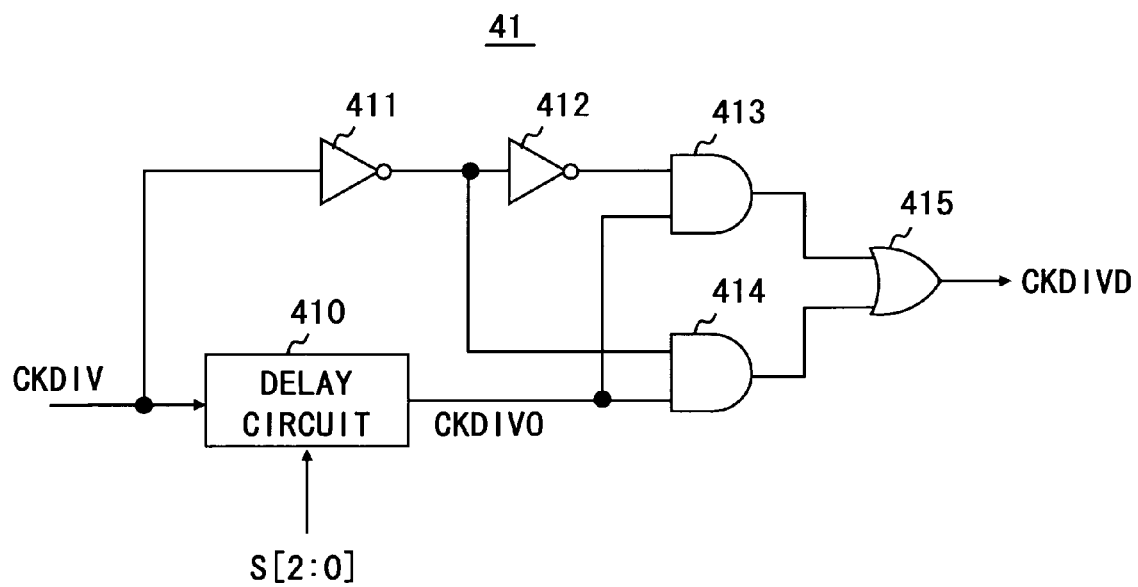
FIG. 21 is a configuration diagram of an expected value generation section included in the duty comparison circuit.

Now, a configuration example of the expected value generation section 41 will be shown in FIG. 21. When the control signal S[2:0] designates the duty ratio DUS % smaller than 50%, the expected value generation section 41 needs to delay the input signal CKDIV by delay time ΔCKDIV as shown in expression (17) below. When the control signal S[2:0] designates the duty ratio DUL % larger than 50%, the expected value generation section 41 needs to delay the input signal CKDIV by delay time ΔCKDIV as shown in expression (18) below. Therefore, the expected value generation section 41 needs to change the size of the delay time ΔCKDIV according to the value of the control signal S[2:0]. Note that a setup 42 is the setup time of the DFF 42. TH1 shows the time passing through the AND circuit 24 in FIG. 5, TH2 shows the time passing through the OR circuit 23 in FIG. 5, TH3 is the time passing through the selector 25 in FIG. 5, TH4 is the time passing through the selector 26 in FIG. 5, and TH10 is the time passing through the DFF 40 in FIG. 20.

$$\Delta CKDIV = P_{PER}*DUS/100 - SETUP42 + TH1 + TH3 + TH4 - TH10 \quad (17)$$

$$\Delta CKDIV = P_{PER}*DUL/100 - SETUP42 + TH2 + TH3 + TH4 - TH10 \quad (18)$$

In a configuration example shown in FIG. 21, the expected value generation section 41 includes a delay circuit 410, inverters 411 and 412, AND circuits 413 and 414, and an OR circuit 415. The delay circuit 410 delays the input signal CKDIV to output the delay signal CKDIVO. The delay time ΔCKDIVO given to the input signal CKDIV by the delay circuit 410 is expressed by expression (19) below when the control signal S[2:0] designates the duty ratio DUS % smaller than 50%. On the other hand, the delay time ΔCKDIVO is expressed by expression (20) below when the control signal S[2:0] designates the duty ratio DUL % larger than 50%. Δ414 is the time passing through the AND circuit 414. Δ415 is the time passing through the OR circuit 415.

$$\Delta CKDIVO = P_{PER}*DUS/100 - \$setup + TH1 + TH3 + TH4 - TH10 - \Delta414 - \Delta415 \quad (19)$$

$$\Delta CKDIVO = P_{PER}*DUL/100 - \$setup + TH2 + TH3 + TH4 - TH10 - \Delta414 - \Delta415 \quad (20)$$

Figure 22:
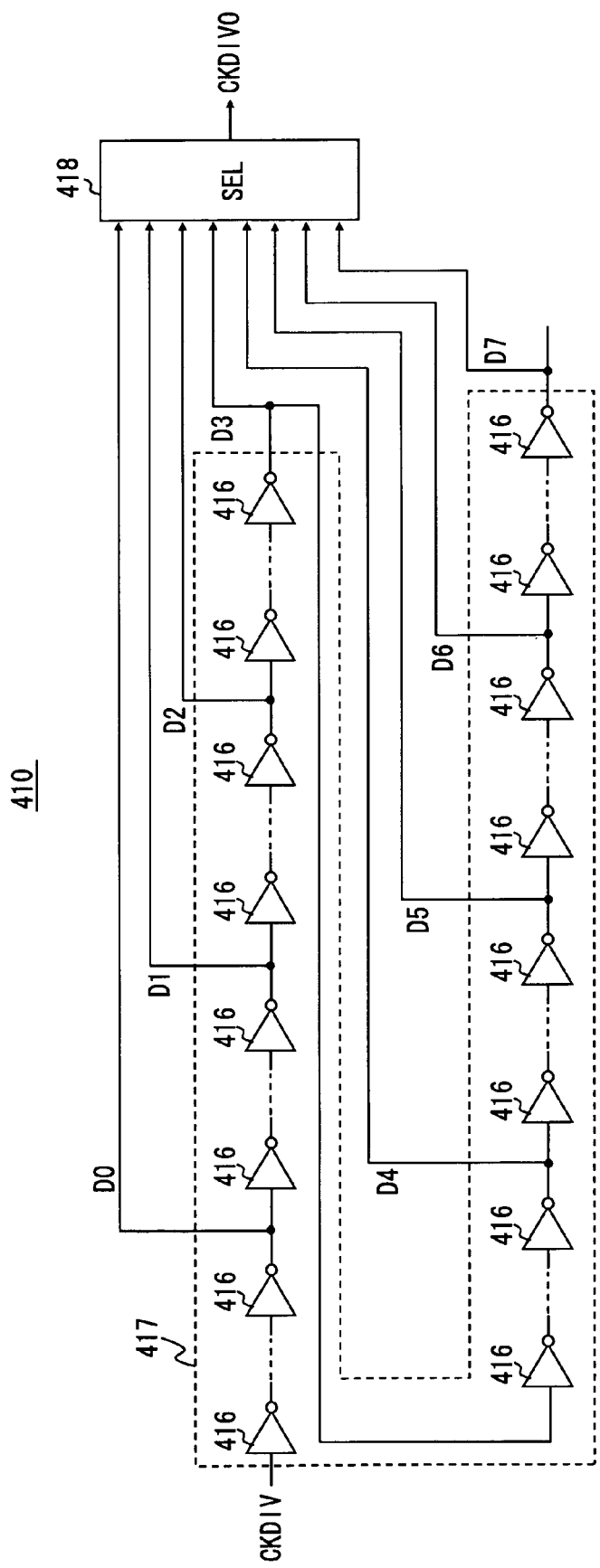
FIG. 22 is a configuration diagram of the delay circuit included in the expected value generation section.

A configuration example of the delay circuit 410 included in the expected value generation section 41 is shown in FIG. 22. In the duty comparison circuit 4, signal CKDIVD, which is expected value, is needed in order to determine whether the output clock signal PLLD is regulated to the desired duty ratio DUS % or DUL % designated by the control signal S[2:0]. The signal CKDIVD is obtained by delaying the input signal CKDIV that is input to the expected value generation section 41 by the delay time shown in the expressions (17) or (18) as stated above. Therefore, the delay circuit 410 is needed to selectively generate the delay time depending on the duty ratio designated by the control signal S[2:0]. The delay circuit 410 shown in FIG. 22 generates eight different delay signals d0 to d7 according to eight different duty ratios designated by the control signal S[2:0] by delaying the input signal CKDIV by a delay line 417 having inverters 416 connected in series.

The delay times ΔD0 to ΔD7 of the delay signals d0 to d7 to the input signal CKDIV can be expressed by expressions (21) to (28) below. Note that TH12 is the time passing through a selector 418.

$$\Delta D0 = P_{PER} * 30/100 - SETUP42 + TH1 + TH3 + TH4 - TH10 - \Delta 414 - \Delta 415 - TH12 \quad (21)$$

$$\Delta D1 = P_{PER} * 35/100 - SETUP42 + TH1 + TH3 + TH4 - TH10 - \Delta 414 - \Delta 415 - TH12 \quad (22)$$

$$\Delta D2 = P_{PER} * 40/100 - SETUP42 + TH1 + TH3 + TH4 - TH10 - \Delta 414 - \Delta 415 - TH12 \quad (23)$$

$$\Delta D3 = P_{PER} * 45/100 - SETUP42 + TH1 + TH3 + TH4 - TH10 - \Delta 414 - \Delta 415 - TH12 \quad (24)$$

$$\Delta D4 = P_{PER} * 55/100 - SETUP42 + TH2 + TH3 + TH4 - TH10 - \Delta 414 - \Delta 415 - TH12 \quad (25)$$

$$\Delta D5 = P_{PER} * 60/100 - SETUP42 + TH2 + TH3 + TH4 - TH10 - \Delta 414 - \Delta 415 - TH12 \quad (26)$$

$$\Delta D6 = P_{PER} * 65/100 - SETUP42 + TH2 + TH3 + TH4 - TH10 - \Delta 414 - \Delta 415 - TH12 \quad (27)$$

$$\Delta D7 = P_{PER} * 70/100 - SETUP42 + TH2 + TH3 + TH4 - TH10 - \Delta 414 - \Delta 415 - TH12 \quad (28)$$

The selector 418 shown in FIG. 22 selects the delay signal corresponding to the duty ratio designated by the control signal S[2:0] from among eight different delay signals d0 to d7 generated by the delay line 417 to output the selected signal as the delay signal CKDIVO. The selection logic of the selector 418 is shown in FIG. 23.

Figure 24:
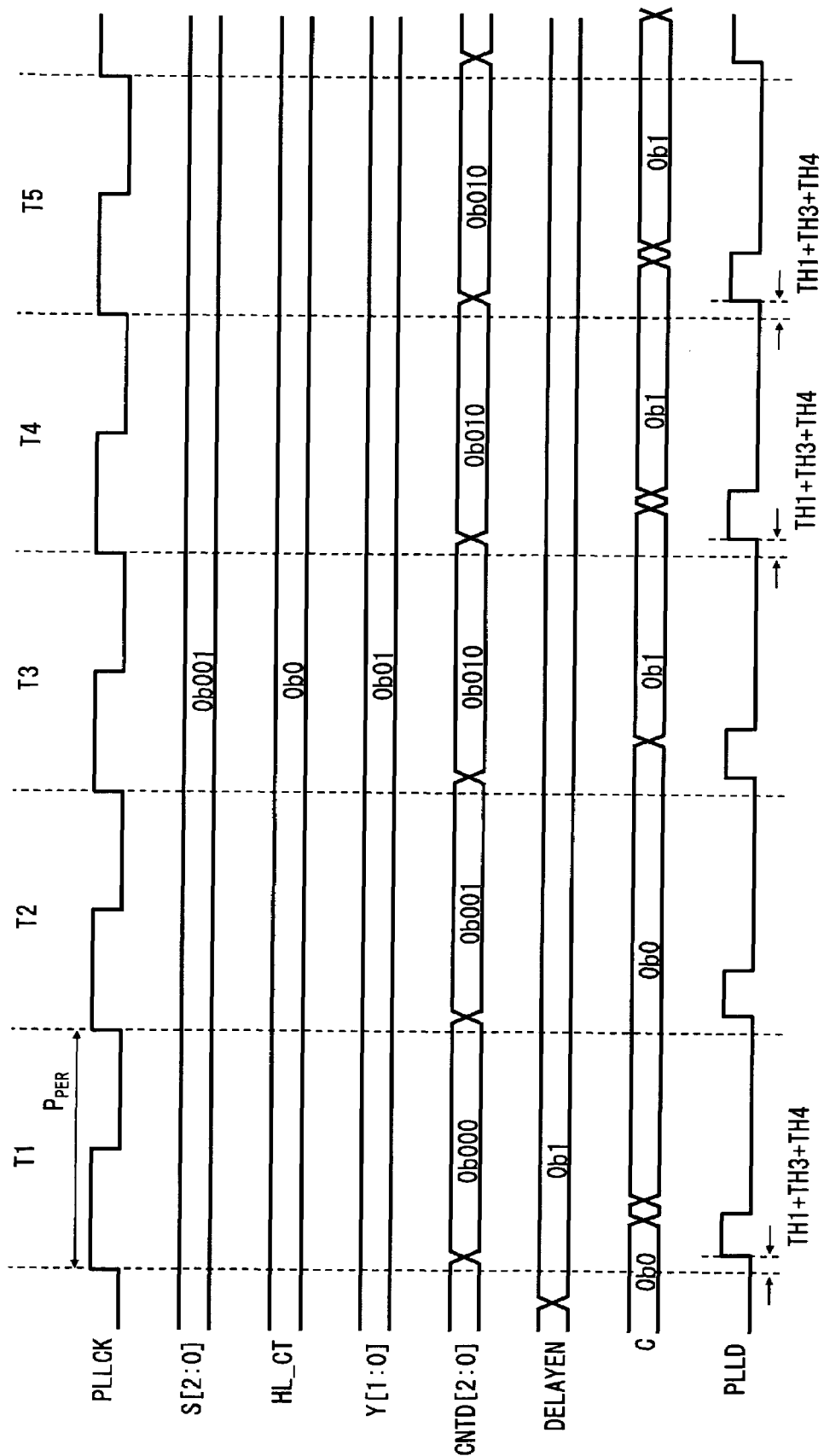
FIG. 24 is a timing chart showing a behavior of the clock duty changing apparatus according to the first embodiment of the invention.

Hereinafter, the behavior of the clock duty changing apparatus 100 according to the first embodiment will be described in detail. FIG. 24 is a timing chart showing a case in which the duty ratio or High level period of the input clock signal PLLCK is decreased by the clock duty changing apparatus 100.

In an example in FIG. 24, the value of the control signal S[2:0] is set to 0b001 and the set value of the duty ratio of the output clock signal PLLD is 40%. The value of the enable signal DELAYEN is set to 0b1 at the beginning of a term T1 to start regulation of the duty ratio on the input clock signal PLLCK. At this time, the initial value of the control signal CNTD[2:0] input to the duty regulation circuit 2 is 0b000. The duty regulation circuit 2 regulates the duty ratio depending on the set values of the S[2:0] and CNTD[2:0] to output the output clock signal PLLD. In the term T1, it is determined by the duty comparison circuit 4 that the output clock signal PLLD is not regulated to the desired value (40%) and the value of the control signal C is set to 0b0. The duty correction circuit 3 renews the value of the CNTD[2:0] to 0b001 depending on the control signal C input from the duty comparison circuit 4 by the end of the term T1.

Then the renewed value of the control signal CNTD[2:0] is taken into the duty regulation circuit 2 at the rising edge of the input clock signal PLLCK in a term T2. The duty regulation circuit 2 regulates the duty ratio according to the renewed value of the CNTD[2:0] to output the output clock signal PLLD. Such a regulation is repeatedly performed for each clock cycle of the input clock signal PLLCK. In the example shown in FIG. 24, the duty ratio of the output clock signal PLLD is converged to the desired value (40%) in a term T3, and the value of the control signal C output from the duty comparison circuit 4 is set to 0b1. The value of the control signal CNTD[2:0] output from the duty correction circuit 3 is kept to the value at the point where the duty ratio of the output clock signal PLLD is converged.

Figure 25:
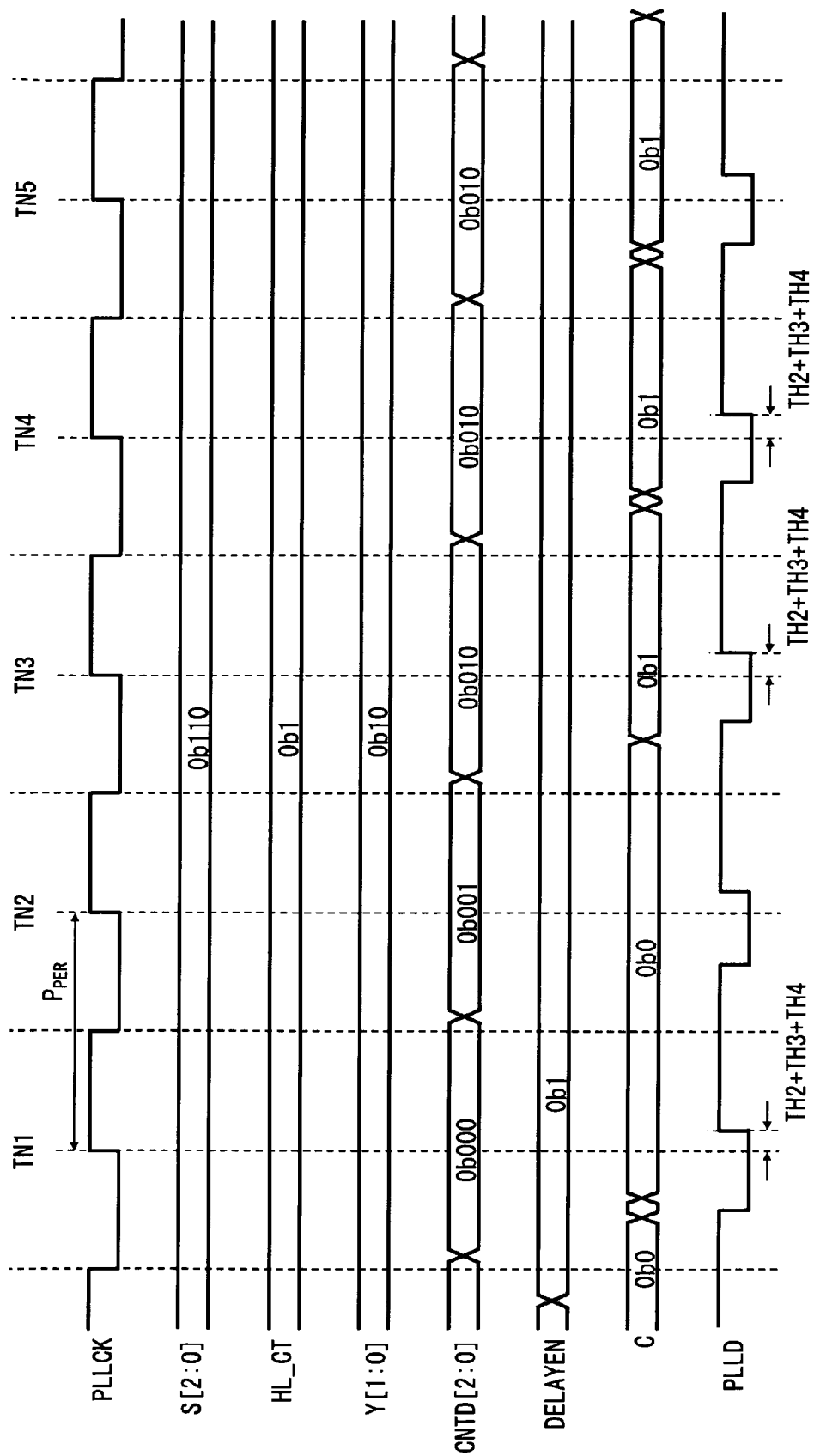
FIG. 25 is a timing chart showing a behavior of the clock duty changing apparatus according to the first embodiment of the invention.

On the other hand, FIG. 25 is a timing chart showing a case in which the duty ratio or the High level period of the input clock signal PLLCK is increased by the clock duty changing apparatus 100. In an example in FIG. 25, the value of the control signal S[2:0] is set to 0b110, and the set value of the duty ratio of the output clock signal PLLD is 60%.

The value of the enable signal DELAYEN is set to 0b1 at the beginning of a term TN1 to start regulation of the duty ratio on the input clock signal PLLCK. At this time, the initial value of the control signal CNTD[2:0] input to the duty regulation circuit 2 is 0b000. The duty regulation circuit 2 regulates the duty ratio depending on the set values of S[2:0] and CNTD[2:0] to output the output clock signal PLLD. In the term TN1, it is determined by the duty comparison circuit 4 that the output clock signal PLLD is not regulated to the desired value (60%), and the value of the control signal C is set to 0b0. The duty correction circuit 3 renews the value of the CNTD[2:0] to 0b001 depending on the control signal C input from the duty comparison circuit 4 by the end of the term TN1.

Then the renewed value of the control signal CNTD[2:0] is taken into the duty regulation circuit 2 at the falling edge of the input clock signal PLLCK in a term TN2. The duty regulation circuit 2 regulates the duty ratio according to the renewed value of the CNTD[2:0] to output the output clock signal PLLD. Such a regulation is repeatedly performed for each clock cycle of the input clock signal PLLCK. In the example shown in FIG. 25, the duty ratio of the output clock signal PLLD is converged to the desired value (60%) in a term TN3, and the value of the control signal C output from the duty comparison circuit 4 is set to 0b1. The value of the control signal CNTD[2:0] output from the duty correction circuit 3 is kept to the value at the point where the duty ratio of the output clock signal PLLD is converged.

Figure 26:
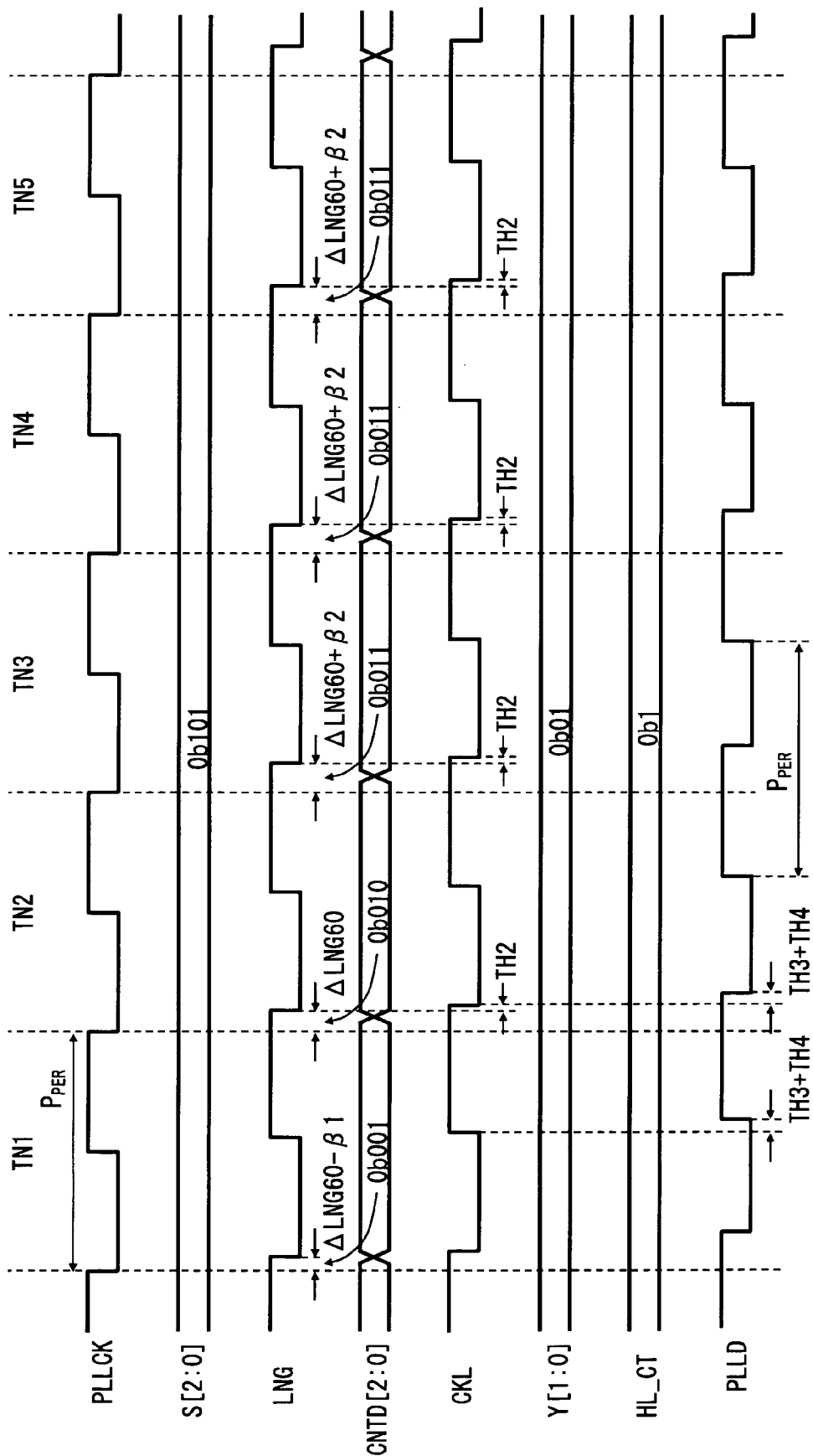
FIG. 26 is a timing chart showing a behavior of the duty regulation circuit included in the clock duty changing apparatus according to the first embodiment of the invention.
Figure 27:
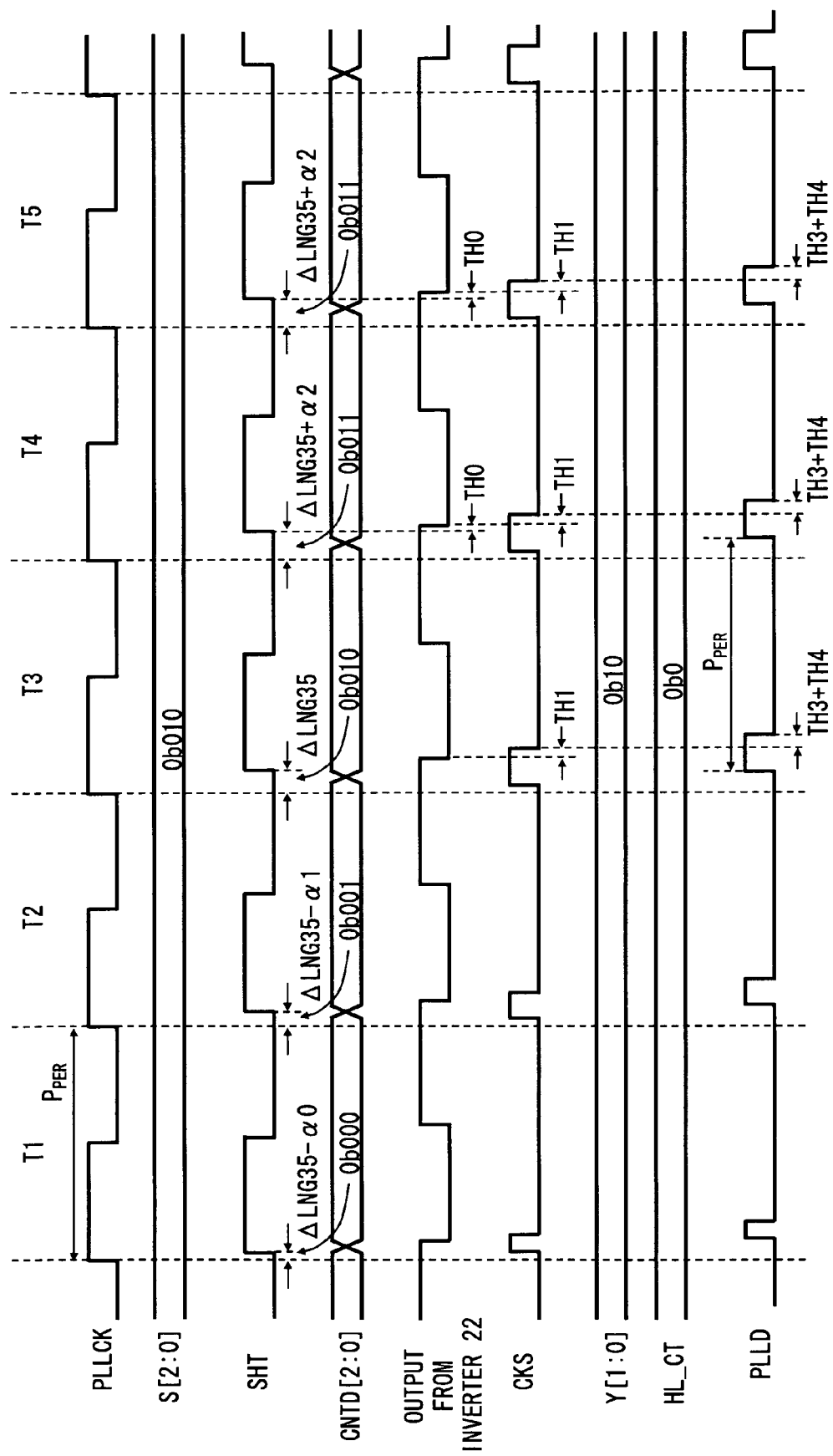
FIG. 27 is a timing chart showing a behavior of the duty regulation circuit.

Now, the behavior of the duty regulation circuit 2 shown in FIG. 5 is described using timing charts in FIGS. 26 and 27. FIG. 26 is a timing chart showing a case in which the duty ratio of the input clock signal PLLCK is increased. When the High level period of the input clock signal PLLCK is increased, the value of the control signal HL_CT is set to 0b1, and the signal LNG or CKL is selected as the output signal by the selector 25 shown in FIG. 5. The delay time ΔLNGDUL of the signal LNG output from the delay selection circuit 21 when the duty ratio DUL % larger than 50% is designated by the control signal S[2:0] can be expressed by expression (29) below.

$$\Delta LNGDUL = P_{PER} * (DUL - 50)/100 \quad (29)$$

As can be seen from the expression (29), when the duty ratio designated by the S[2:0] is changed, ΔLNGDUL is also needed to be changed. More specifically, the delay time ΔLNG 55 of the signal LNG when the duty ratio is 55% is $P_{PER}*(55-50)/100$. The delay time ΔLNG 60 of the signal LNG when the duty ratio is 60% is $P_{PER}*(60-50)/100$. The delay time ΔLNG 65 of the signal LNG when the duty ratio is 65% is $P_{PER}*(65-50)/100$. The delay time ΔLNG 70 of the signal LNG when the duty ratio is 70% is $P_{PER}*(70-50)/100$. The delay selection circuit 21 shown in FIG. 5 selects ΔLNGDUL corresponding to the duty ratio designated by the control signal S[2:0] by referring to the control signal Y[1:0].

Further, due to the tolerance in production process or degradation after production, deviation may occur in the delay times ΔLNG 55, ΔLNG 60, ΔLNG 65, and ΔLNG 70. In order to reduce the duty ratio of the output clock signal PLLD being deviated from the value designated by the control signal S[**2:

0] due to the deviation in the delay times ΔLNG55, ΔLNG 60, ΔLNG 65, and ΔLNG 70, the delay selection circuit 21 shown in FIG. 5 is able to output the signal LNG having five different delay times for each duty ratio as shown in the expressions (12) to (16). The specific values of the delay time ΔLNGDUL are as follows. First, when the set value of the duty ratio is 55%, the values may be ΔLNG55-β0, ΔLNG55-β1, ΔLNG55, ΔLNG55+β2, and ΔLNG55+β3. When the set value of the duty ratio is 60%, the values may be ΔLNG60-β0, ΔLNG60-β1, ΔLNG60, ΔLNG60+β2, and ΔLNG60+β3. When the set value of the duty ratio is 65%, the values may be ΔLNG65-β0, ΔLNG65-β1, ΔLNG65, ΔLNG65+β2, and ΔLNG65+β3. When the set value of the duty ratio is 70%, the values may be ΔLNG70-β0, ΔLNG70-β1, ΔLNG70, ΔLNG70+β2, and ΔLNG70+β3.

The delay selection circuit 21 included in the duty regulation circuit 2 selects the delay time ΔLNGDUL of the output signal LNG according to the control signals Y[1:0] and CNTD[2:0]. In the example in FIG. 26, the value of the control signal S[2:0] is 0b101 and duty ratio of 60% is designated. In the term TN2 in FIG. 26, the value of the control signal CNTD[2:0] input to the duty regulation circuit 2 is 0b010 and the delay time ΔLNGDUL of the signal LNG is ΔLNG60. In the term TN3, the value of the control signal CNTD[2:0] input to the duty regulation circuit 2 is 0b011 and the delay time ΔLNGDUL of the signal LNG is increased to ΔLNG60+β2. The signal CKL is generated based on the signal LNG thus generated to further generate the output clock signal PLLD.

FIG. 27 is a timing chart showing a case in which the duty ratio of the input clock signal PLLCK is decreased. When the High level period of the input clock signal PLLCK is decreased, the value of the control signal HL_CT is set to 0b0, and the signal SHT or CKS is selected as the output signal by the selector 25 shown in FIG. 5. The delay time ΔSHTDUS of the signal SHT output from the delay selection circuit 20 when the duty ratio DUS % smaller than 50% is designated by the control signal S[2:0] can be expressed by expression (30) below.

$$\Delta SHTDUS = P_{PER}*DUS/100 - TH0 \quad (30)$$

The delay selection circuit 20 shown in FIG. 5 is able to output the signal SHT having five different delay times for each duty ratio as in the delay selection circuit 21. The specific value of the delay time ΔSHTDUS of the signal SHT is as follows. First, when the set value of the duty ratio is 45%, the values are ΔSHT45-α0, ΔSHT45-α1, ΔSHT45, ΔSHT45+α2, and ΔSHT45+α3. When the set value of the duty ratio is 40%, the values are ΔSHT40-α0, ΔSHT40-α1, ΔSHT40, ΔSHT40+α2, and ΔSHT40+α3. When the set value of the duty ratio is 35%, the values are ΔSHT35-α0, ΔSHT35-α1, ΔSHT35, ΔSHT35+α2, and ΔSHT35+α3. When the set value of the duty ratio is 30%, the values are ΔSHT30-α0, ΔSHT30-α1, ΔSHT30, ΔSHT30+α2, and ΔSHT30+α3.

The delay selection circuit 20 included in the duty regulation circuit 2 selects the delay time ΔSHTDUS of the output signal SHT according to the control signals Y[1:0] and CNTD [2:0]. In the example in FIG. 27, the value of the control signal S[2:0] is 0b010 and duty ratio of 35% is designated. In the term T2 in FIG. 27, the value of the control signal CNTD[2:0] input to the duty regulation circuit 2 is 0b001 and the delay time ΔSHTDUS of the signal SHT is ΔSHT35-α1. In the term T3, the value of the control signal CNTD[2:0] input to the duty regulation circuit 2 is 0b010 and the delay time ΔSHTDUS of the signal SHT is increased to ΔLNG35. The signal CKS is generated based on the signal SHT thus generated to further generate the output clock signal PLLD.

Figure 28:
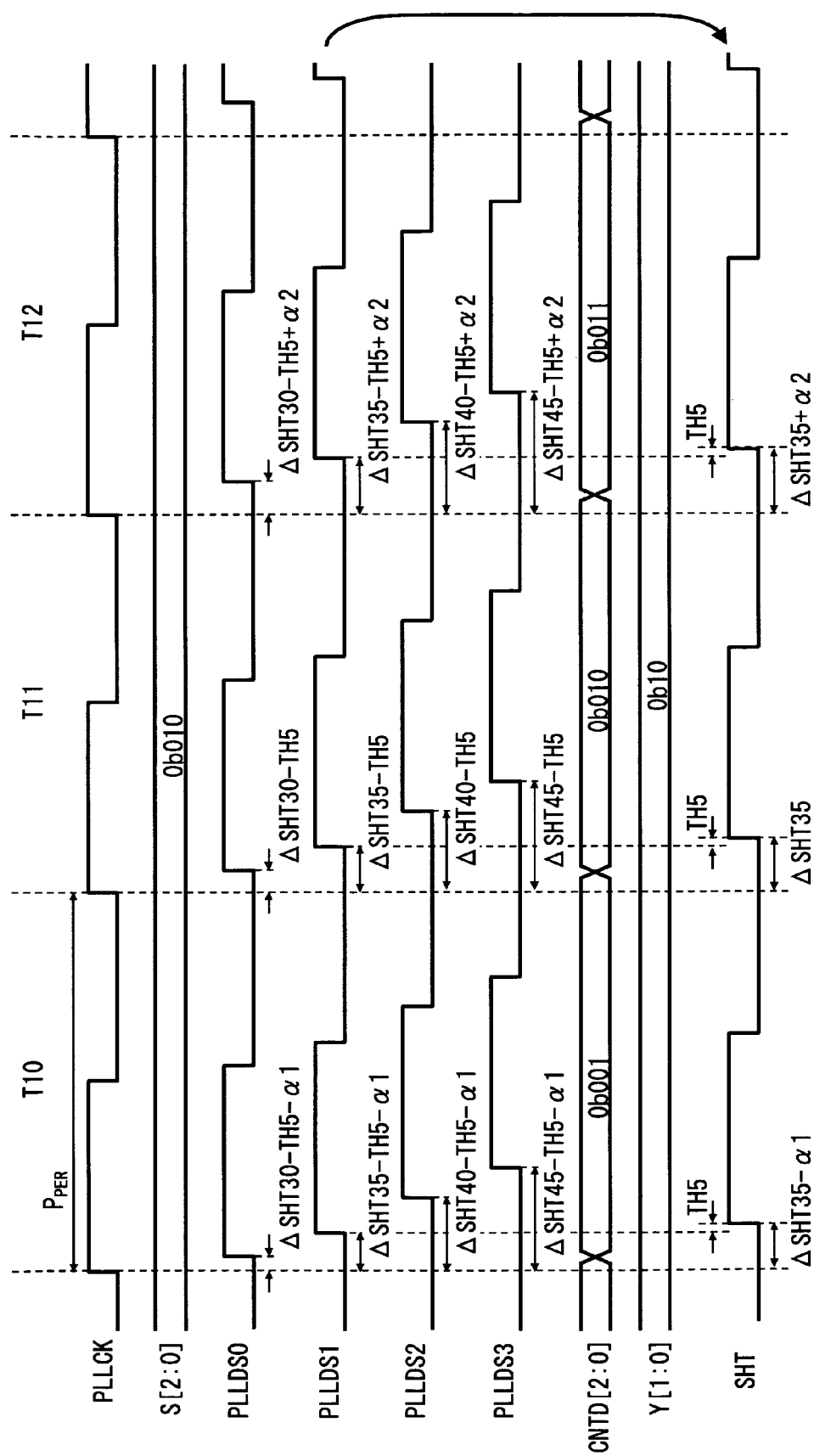
FIG. 28 is a timing chart showing a behavior of the delay selection circuit included in the duty regulation circuit.

Now, a behavior of the delay selection circuit 20 shown in FIG. 8 will be described in detail using a timing chart in FIG. 28. FIG. 28 is the timing chart showing a case where the duty ratio of the input clock signal PLLCK is decreased. The delay selection circuit 20 needs to output the signal SHT generated by delaying the input clock signal PLLCK by the delay time ΔSHTDUS shown in the expression (30) above. The delay time of the signal SHT is also needed to be changed according to the value of the control signal S[2:0]. Therefore, the delay selection circuit 20 in FIG. 8 employs a configuration of generating a plurality of delay signals generated by delaying the input clock signal PLLCK according to the calculation formula of the ΔSHTDUS and selecting one signal from the plurality of delay signals according to the signal Y[1:0] obtained from the control signal S[2:0] to output the selected signal as the signal SHT.

The value of the duty ratio smaller than 50% designated by the control signal S[2:0] can be any. In the first embodiment, it is possible to designate four different duty ratios of 30%, 35%, 40%, and 45%. Therefore, the delay selection circuit 20 in FIG. 8 needs to select the delay time of the signal SHT from four different delay times as shown in expressions (31) to (34) as follows.

$$\Delta SHT30 = P_{PER}*30/100 - TH0 \quad (31)$$

$$\Delta SHT35 = P_{PER}*35/100 - TH0 \quad (32)$$

$$\Delta SHT40 = P_{PER}*40/100 - TH0 \quad (33)$$

$$\Delta SHT45 = P_{PER}*45/100 - TH0 \quad (34)$$

The delay selection circuit 20 in FIG. 8 successively passes PLLCK through the four delay circuits 200 to 203 to generate four different delay signals PLLDS0 to PLLDS3 having different delay times. As a matter of course, the delay time increases as the signal PLLCK passes through the delay circuits. Therefore, the magnitude relationship among the delay times ΔPLLDS0 to ΔPLLDS3 of each of the delay signals PLLDS0 to PLLDS3 is ΔPLLDS0<ΔPLLDS1<ΔPLLDS2<ΔPLLDS3 <$P_{PER}/2$. $P_{PER}$ is the period of the input clock signal PLLCK. ΔPLLDS0 to ΔPLLDS3 can be expressed by the following expressions (35) to (38).

$$\Delta PLLDS0 = P_{PER}*30/100 - TH0 - TH5 \quad (35)$$

$$\Delta PLLDS1 = P_{PER}*35/100 - TH0 - TH5 \quad (36)$$

$$\Delta PLLDS2 = P_{PER}*40/100 - TH0 - TH5 \quad (37)$$

$$\Delta PLLDS3 = P_{PER}*45/100 - TH0 - TH5 \quad (38)$$

In order to decrease the High level period of the output clock signal PLLD, the delay time of the signal SHT is needed to be decreased. Therefore, as shown in FIG. 9, the selector 204 included in the delay selection circuit 20 selects the delay signal PLLDS0 output from the delay circuit 200 when the value of control signal Y[1:0] is 0b11 and the set value of the duty ratio is 30%. In order to compensate the deviation of the duty ratio of the output clock signal PLLD due to the production tolerance or the like, each of the delay circuits 200 to 203 needs to selectively generate the five different delay times, as showing in FIGS. 10 to 12. Specifically, the delay circuit 200 is able to select five different delay times shown in (39) to (43).

$$\Delta PLLDS0\_0 = P_{PER}*30/100 - TH0 - TH5 - \alpha 0 = \Delta SHT30 - TH5 - \alpha 0 \quad (39)$$

$$\Delta PLLDS0\_1 = P_{PER}*30/100 - TH0 - TH5 - \alpha1 = \Delta SHT30 - TH5 - \alpha1 \quad (40)$$

$$\Delta PLLDS0\_2 = P_{PER}*30/100 - TH0 - TH5 = \Delta SHT30 - TH5 \quad (41)$$

$$\Delta PLLDS0\_3 = P_{PER}*30/100 - TH0 - TH5 + \alpha2 = \Delta SHT30 - TH5 + \alpha2 \quad (42)$$

$$\Delta PLLDS0\_4 = P_{PER}*30/100 - TH0 - TH5 + \alpha3 = \Delta SHT30 - TH5 + \alpha3 \quad (43)$$

The delay circuit 201 is able to select five different delay times shown in (44) to (48).

$$\Delta PLLDS1\_0 = P_{PER}*35/100 - TH0 - TH5 - \alpha0 = \Delta SHT35 - TH5 - \alpha0 \quad (44)$$

$$\Delta PLLDS1\_1 = P_{PER}*35/100 - TH0 - TH5 - \alpha1 = \Delta SHT35 - TH5 - \alpha1 \quad (45)$$

$$\Delta PLLDS1\_2 = P_{PER}*35/100 - TH0 - TH5 = \Delta SHT35 - T5 \quad (46)$$

$$\Delta PLLDS1\_3 = P_{PER}*35/100 - TH0 - TH5 + \alpha2 = \Delta SHT35 - TH5 + \alpha2 \quad (47)$$

$$\Delta PLLDS1\_4 = P_{PER}*35/100 - TH0 - TH5 + \alpha3 = \Delta SHT35 - TH5 + \alpha3 \quad (48)$$

The delay circuit 202 is able to select five different delay times shown in (49) to (53).

$$\Delta PLLDS2\_0 = P_{PER}*40/100 - TH0 - TH5 - \alpha0 = \Delta SHT40 - TH5 - \alpha0 \quad (49)$$

$$\Delta PLLDS2\_1 = P_{PER}*40/100 - TH0 - TH5 - \alpha1 = \Delta SHT40 - TH5 - \alpha1 \quad (50)$$

$$\Delta PLLDS2\_2 = P_{PER}*40/100 - TH0 - TH5 = \Delta SHT40 - TH5 \quad (51)$$

$$\Delta PLLDS2\_3 = P_{PER}*40/100 - TH0 - TH5 + \alpha2 = \Delta SHT40 - TH5 + \alpha2 \quad (52)$$

$$\Delta PLLDS2\_4 = P_{PER}*40/100 - TH0 - TH5 + \alpha3 = \Delta SHT40 - TH5 + \alpha3 \quad (53)$$

The delay circuit 203 is able to select five different delay times shown in (54) to (58).

$$\Delta PLLDS3\_0 = P_{PER}*45/100 - TH0 - TH5 - \alpha0 = \Delta SHT45 - TH5 - \alpha0 \quad (54)$$

$$\Delta PLLDS3\_1 = P_{PER}*45/100 - TH0 - TH5 - \alpha1 = \Delta SHT45 - TH5 - \alpha1 \quad (55)$$

$$\Delta PLLDS3\_2 = P_{PER}*45/100 - TH0 - TH5 = \Delta SHT45 - TH5 \quad (56)$$

$$\Delta PLLDS3\_3 = P_{PER}*45/100 - TH0 - TH5 + \alpha2 = \Delta SHT45 - TH5 + \alpha2 \quad (57)$$

$$\Delta PLLDS3\_4 = P_{PER}*45/100 - TH0 - TH5 + \alpha3 = \Delta SHT45 - TH5 + \alpha3 \quad (58)$$

The delay circuits 200 to 203 determine the delay time that is able to decrease the mismatch between the duty ratio of the output clock signal PLLD and the set value designated by the control signal S[2:0] based on the value of the control signal CNTD[2:0] which varies at the rising edge of the input clock signal PLLCK to output the delay signals PLLDS0 to PLLDS3 to the selector 204. The selector 204 determines the output signal SHT according to the logic shown in FIG. 9. In the example in FIG. 28, the value of the control signal S[2:0] is 0b010 and the duty ratio of 35% is designated. Therefore, the delay signal PLLDS1 is selected as the signal SHT. Note that the control signal CNTD[2:0] varies at the rising edge of the input clock signal PLLCK, and the delay times of the PLLDS0 to PLLDS3 are changed depending on the value of the CNTD[2:0]. For example, in a term T11, the value of the CNTD[2:0] is 0b010, and the delay time of the signal PLLDS1 is ΔSHT35-TH5. In a term T12, the value of the CNTD[2:0] is 0b011, and the delay time of the signal PLLDS1 is ΔSHT35-TH5+α2.

Figure 29:
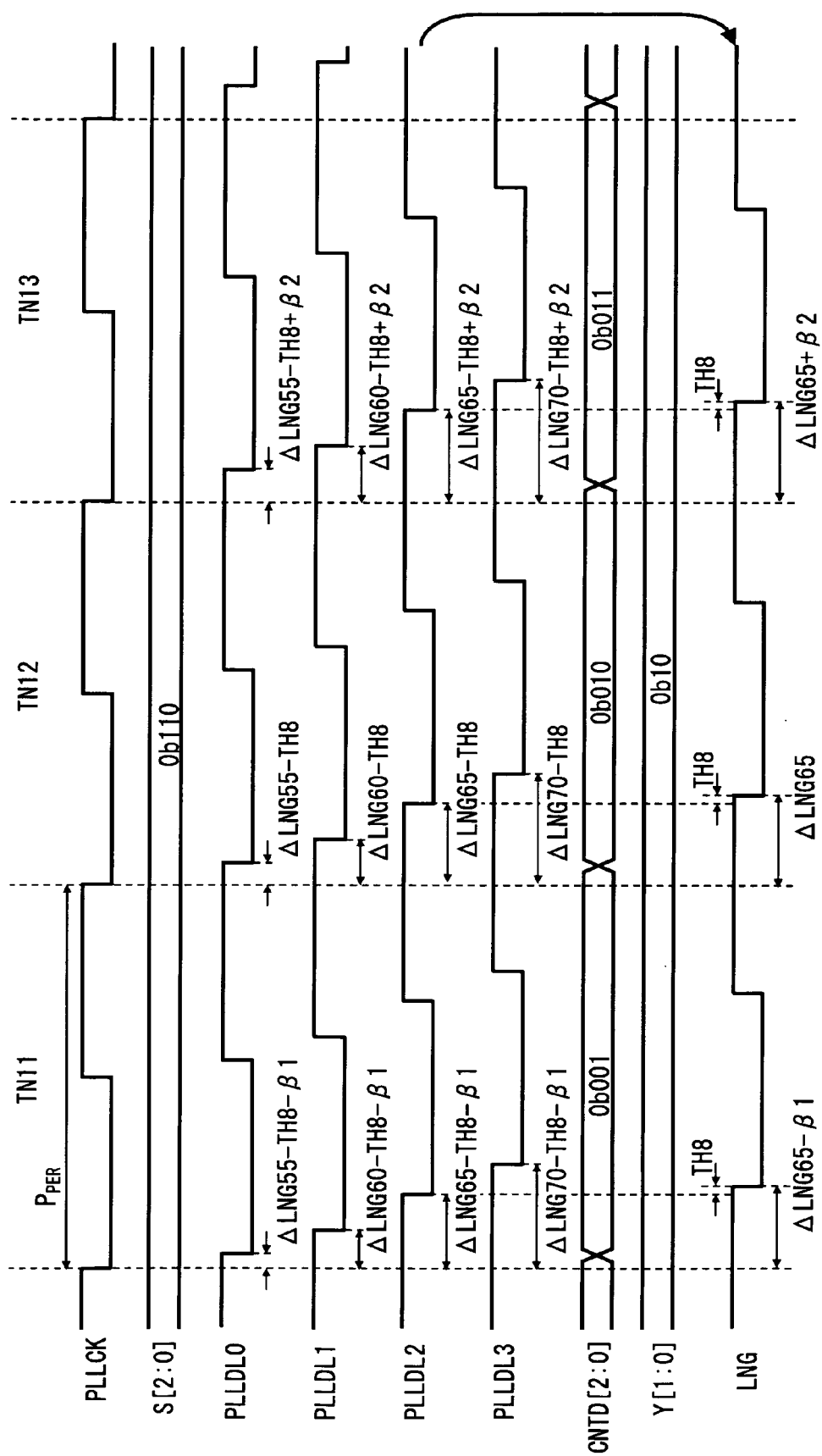
FIG. 29 is a timing chart showing a behavior of the delay selection circuit included in the duty regulation circuit.

Now, a behavior of the delay selection circuit 21 shown in FIG. 14 is described in detail using a timing chart in FIG. 29. FIG. 29 is the timing chart showing a case where the duty ratio of the input clock signal PLLCK is increased. The delay selection circuit 21 needs to output the signal LNG generated by delaying the input clock signal PLLCK by the delay time ΔLNGDUL shown in the above expression (29). The delay time of the signal LNG is also needed to be changed according to the value of the control signal S[2:0]. Therefore, the delay selection circuit 21 shown in FIG. 14 employs a configuration of generating a plurality of delay signals generated by delaying the input clock signal PLLCK based on the calculation formula of the ΔLNGDUL and selecting one signal from the plurality of delay signals based on the signal Y[1:0] obtained from the control signal S[2:0] to output the selected signal as the signal LNG.

The value of the duty ratio larger than 50% designated by the control signal S[2:0] can be any. In the first embodiment, it is possible to designate four different duty ratios of 55%, 60%, 65%, and 70%. Therefore, the delay selection circuit 21 in FIG. 14 needs to select the delay time of the signal LNG from four different delay times as shown in expressions (59) to (62) as follows.

$$\Delta LNG55 = P_{PER}*(55-50)/100 \quad (59)$$

$$\Delta LNG60 = P_{PER}*(60-50)/100 \quad (60)$$

$$\Delta LNG65 = P_{PER}*(65-50)/100 \quad (61)$$

$$\Delta LNG70 = P_{PER}*(70-50)/100 \quad (62)$$

The delay selection circuit 21 in FIG. 14 successively passes PLLCK through the four delay circuits 210 to 213 to generate four different delay signals PLLDL0 to PLLDL3 having different delay times. As a matter of course, the delay time increases as the signal PLLCK passes through the delay circuits. Therefore, the magnitude relationship among the delay times ΔPLLDL0 to ΔPLLDL3 of each of the delay signals PLLDL0 to PLLDL3 is ΔPLLDL0<ΔPLLDL1<ΔPLLDL2<ΔPLLDL3<$P_{PER}$/2. $P_{PER}$ is the period of the input clock signal PLLCK. ΔPLLDL0 to ΔPLLDL3 can be expressed by the following expressions (63) to (66).

$$\Delta PLLDS0 = P_{PER}*(55-50)/100 - TH8 \quad (63)$$

$$\Delta PLLDS1 = P_{PER}*(60-50)/100 - TH8 \quad (64)$$

$$\Delta PLLDS2 = P_{PER}*(65-50)/100 - TH8 \quad (65)$$

$$\Delta PLLDS3 = P_{PER}*(70-50)/100 - TH8 \quad (66)$$

In order to increase the High level period of the output clock signal PLLD, the delay time of the signal LNG is needed to be increased. Therefore, as shown in FIG. 15, the selector 214 included in the delay selection circuit 21 selects the delay signal PLLDL3 output from the delay circuit 213 when the value of control signal Y[1:0] is 0b11 and the set value of the duty ratio is 70%. In order to compensate the deviation of the duty ratio of the output clock signal PLLD due to the production tolerance or the like, each of the delay circuits 210 to 213 needs to select five different delay times as shown in FIG. 16. Specifically, the delay circuit 210 is able to select five different delay times shown in (67) to (71).

$$\Delta PLLDL0\_0 = P_{PER}*(55-50)/100 - TH8 - \beta 0 = \Delta LNG55 - TH8 - \beta 0 \quad (67)$$

$$\Delta PLLDL0\_1 = P_{PER}*(55-50)/100 - TH8 - \beta 1 = \Delta LNG55 - TH8 - \beta 1 \quad (68)$$

$$\Delta PLLDL0\_2 = P_{PER}*(55-50)/100 - TH8 = \Delta LNG55 - TH8 \quad (69)$$

$$\Delta PLLDL0\_3 = P_{PER}*(55-50)/100 - TH8 + \beta 2 = \Delta LNG55 - TH8 + \beta 2 \quad (70)$$

$$\Delta PLLDL0\_4 = P_{PER}*(55-50)/100 - TH8 + \beta 3 = \Delta LNG55 - TH8 + \beta 3 \quad (71)$$

The delay circuit 211 is able to select five different delay times shown in (72) to (76).

$$\Delta PLLDL1\_0 = P_{PER}*(60-50)/100 - TH8 - \beta 0 = \Delta LNG60 - TH8 - \beta 0 \quad (72)$$

$$\Delta PLLDL1\_1 = P_{PER}*(60-50)/100 - TH8 - \beta 1 = \Delta LNG60 - TH8 - \beta 1 \quad (73)$$

$$\Delta PLLDL1\_2 = P_{PER}*(60-50)/100 - TH8 = \Delta LNG60 - TH8 \quad (74)$$

$$\Delta PLLDL1\_3 = P_{PER}*(60-50)/100 - TH8 + \beta 2 = \Delta LNG60 - TH8 + \beta 2 \quad (75)$$

$$\Delta PLLDL1\_4 = P_{PER}*(60-50)/100 - TH8 + \beta 3 = \Delta LNG60 - TH8 + \beta 3 \quad (76)$$

The delay circuit 212 is able to select five different delay times shown in (77) to (81).

$$\Delta PLLDL2\_0 = P_{PER}*(65-50)/100 - TH8 - \beta 0 = \Delta LNG65 - TH8 - \beta 0 \quad (77)$$

$$\Delta PLLDL2\_1 = P_{PER}*(65-50)/100 - TH8 - \beta 1 = \Delta LNG65 - TH8 - \beta 1 \quad (78)$$

$$\Delta PLLDL2\_2 = P_{PER}*(65-50)/100 - TH8 = \Delta LNG65 - TH8 \quad (79)$$

$$\Delta PLLDL2\_3 = P_{PER}*(65-50)/100 - TH8 + \beta 2 = \Delta LNG65 - TH8 + \beta 2 \quad (80)$$

$$\Delta PLLDL2\_4 = P_{PER}*(65-50)/100 - TH8 + \beta 3 = \Delta LNG65 - TH8 + \beta 3 \quad (81)$$

The delay circuit 213 is able to select five different delay times shown in (82) to (86).

$$\Delta PLLDL3\_0 = P_{PER}*(70-50)/100 - TH8 - \beta 0 = \Delta LNG70 - TH8 - \beta 0 \quad (82)$$

$$\Delta PLLDL3\_1 = P_{PER}*(70-50)/100 - TH8 - \beta 1 = \Delta LNG70 - TH8 - \beta 1 \quad (83)$$

$$\Delta PLLDL3\_2 = P_{PER}*(70-50)/100 - TH8 = \Delta LNG70 - TH8 \quad (84)$$

$$\Delta PLLDL3\_3 = P_{PER}*(70-50)/100 - TH8 + \beta 2 = \Delta LNG70 - TH8 + \beta 2 \quad (85)$$

$$\Delta PLLDL3\_4 = P_{PER}*(70-50)/100 - TH8 + \beta 3 = \Delta LNG70 - TH8 + \beta 3 \quad (86)$$

The delay circuits 210 to 213 determine the delay time that is able to decrease the mismatch between the duty ratio of the output clock signal PLLD and the set value designated by the control signal S[2:0] based on the value of the control signal CNTD[2:0] which varies at the falling edge of the input clock signal PLLCK to output the delay signals PLLDL0 to PLLDL3 to the selector 214. The selector 214 determines the output signal LNG according to the logic shown in FIG. 15. In the example in FIG. 29, the value of the control signal S[2:0] is 0b110 and the duty ratio of 65% is designated. Therefore, the delay signal PLLDL2 is selected as the signal LNG. Note that the control signal CNTD[2:0] varies at the falling edge of the input clock signal PLLCK, and the delay times of the PLLDL0 to PLLDL3 are changed depending on the value of the CNTD[2:0]. For example, in a term TN12, the value of the CNTD[2:0] is 0b010, and the delay time of the signal PLLDL2 is ΔLNG65−TH8. In a term TN13, the value of the CNTD[2:0] is 0b011, and the delay time of the signal PLLDL2 is ΔLNG65−TH8+β2.

Now, a behavior of the delay circuit 200 shown in FIG. 10 is described in detail with reference to a timing chart in FIG. 30. The delay circuit 200 generates five different delay signals DS00 to DS04 having different delay times by the delay line 2002. The delay times of each of the delay signals DS00 to DS04 to the input clock signal PLLCK can arbitrarily be determined by changing the number of buffers 2001 through which the signal passes. However, the magnitude relationship thereof is needed to be ΔDS00<ΔDS01<DS02<ΔDS03<ΔDS04<$P_{PER}$/2.

Figure 30:
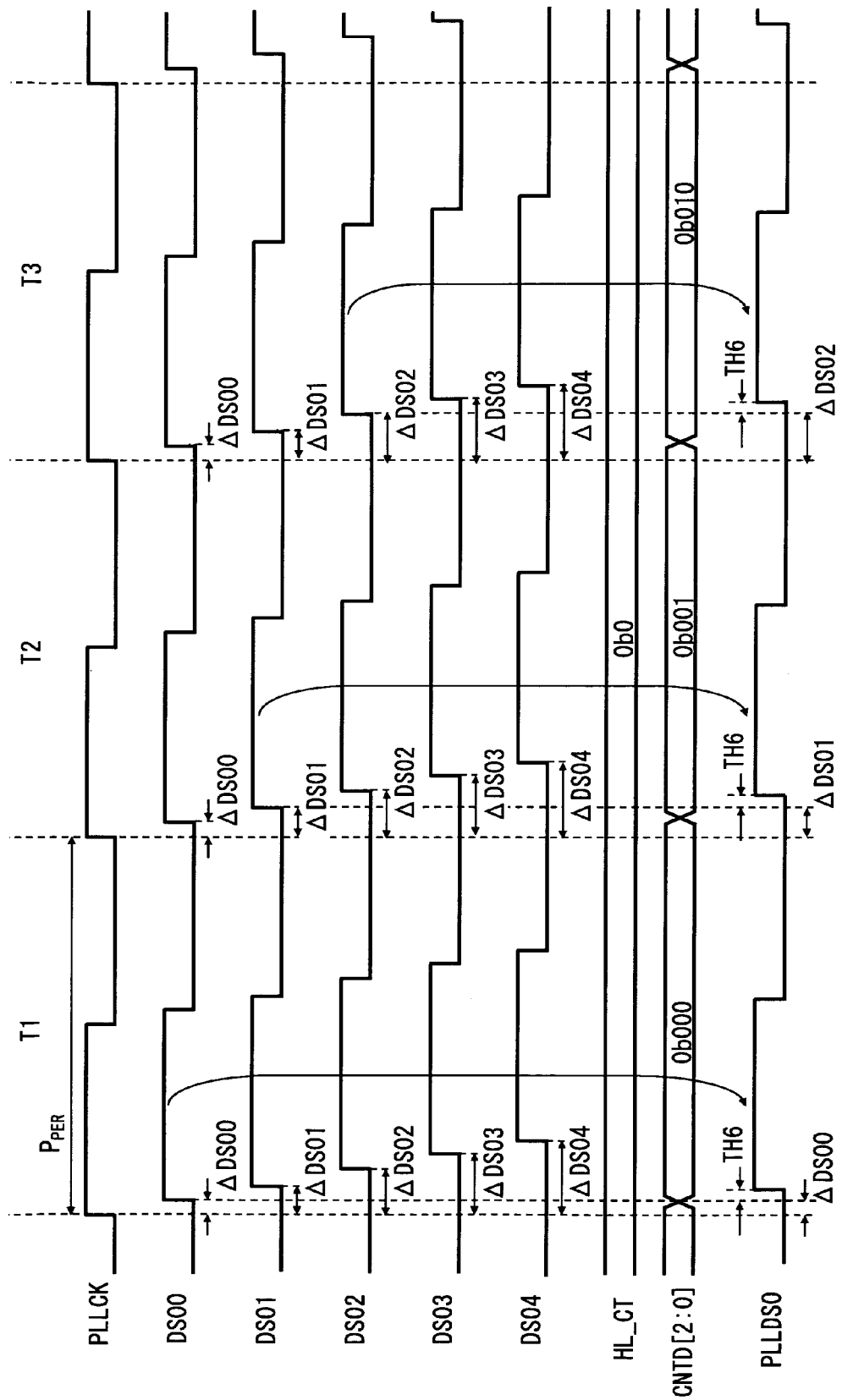
FIG. 30 is a timing chart showing a behavior of the delay circuit included in the delay selection circuit.

In the timing chart in FIG. 30, the value of the control signal CNTD[2:0] is 0b001 in the term T2. Therefore, the selector 2003 selects the delay signal DS01 as the output signal PLLDS0 according to the logic shown in FIG. 11. Further, the value of the control signal CNTD[2:0] is 0b010 in the term T3. Therefore, the selector 2003 selects the delay signal DS02 as the output signal PLLDS0 according to the logic shown in FIG. 11.

Figure 31:
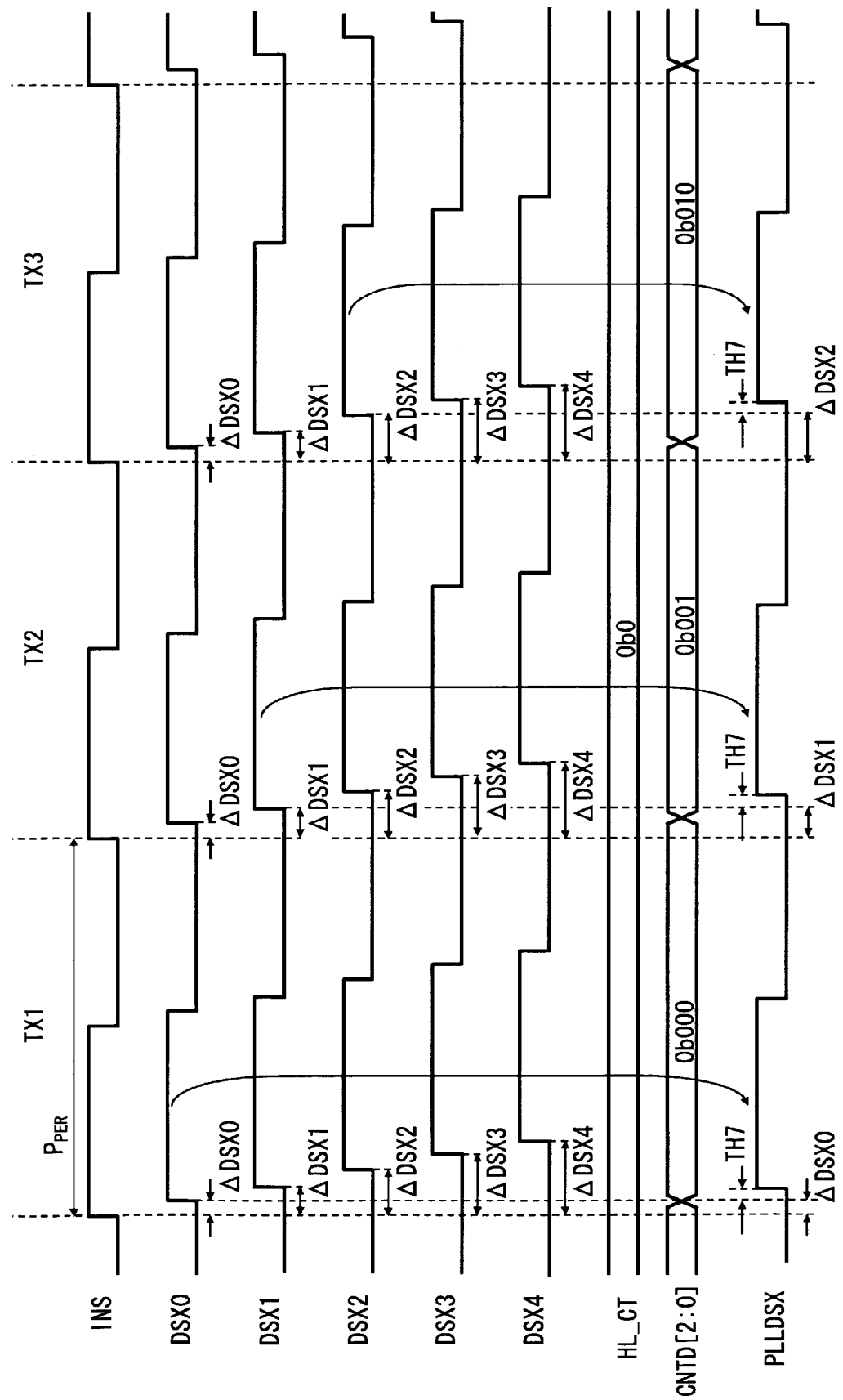
FIG. 31 is a timing chart showing a behavior of the delay circuit included in the delay selection circuit.

The behavior of the delay circuits 201 to 203 is the same as the behavior of the delay circuit 200 described above. FIG. 12 is the diagram in which the delay circuits 200 to 203 are generalized, and FIG. 31 shows a timing chart corresponding to the configuration of the delay circuit in FIG. 12. In the timing chart in FIG. 31, the value of the control signal CNTD [2:0] is 0b001 in a term Tx2. Therefore, the selector 2006 selects the delay signal dsX1 as the output signal PLLDSX according to the logic in FIG. 13. Further, the value of the control signal CNTD[2:0] is 0b010 in a term Tx3. Therefore, the selector 2006 selects the delay signal dsX2 as the output signal PLLDSX according to the logic in FIG. 13.

Figure 32:
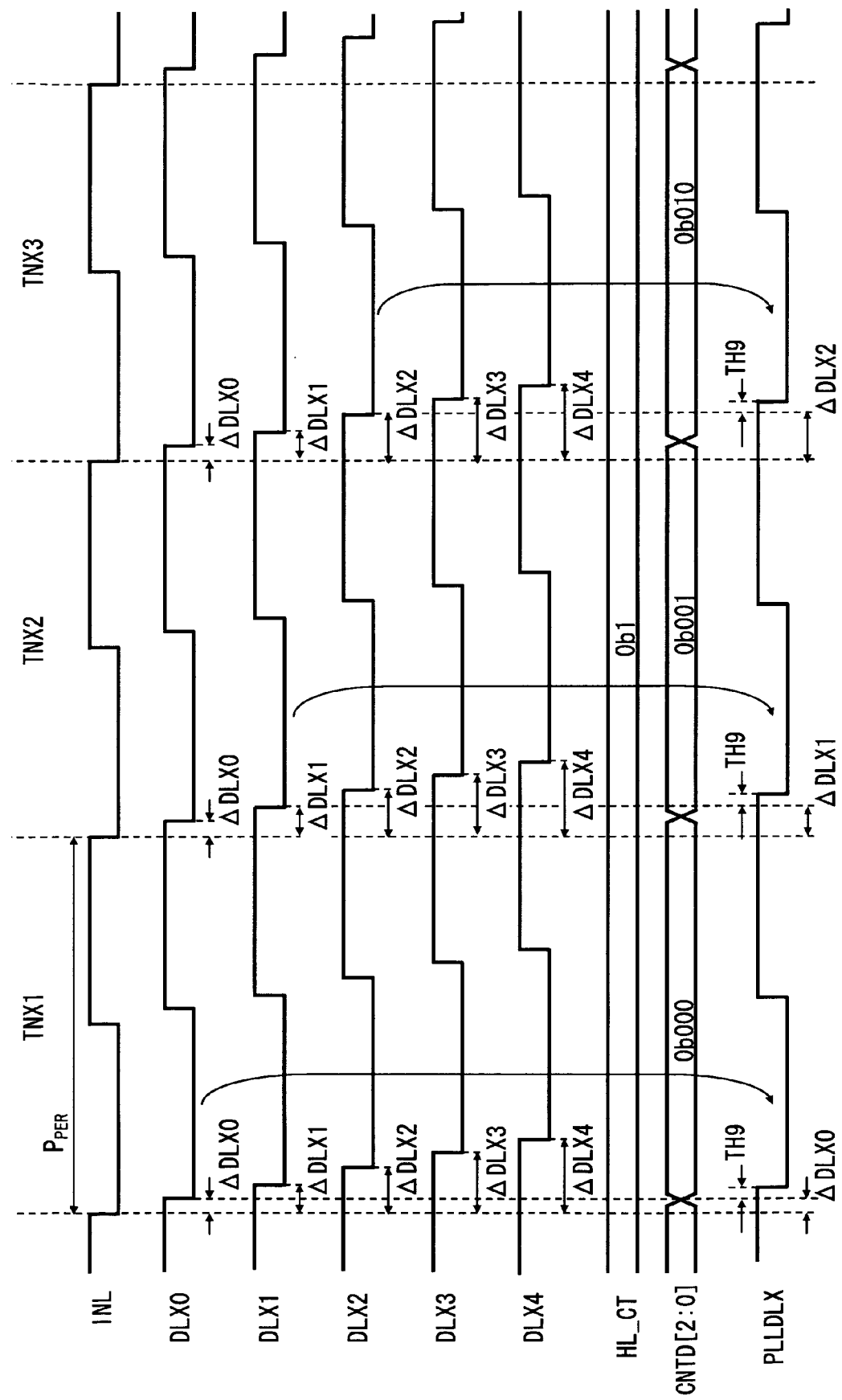
FIG. 32 is a timing chart showing a behavior of the delay circuit included in the delay selection circuit.

Now, a behavior of the delay circuits 210 to 213 shown in FIG. 16 will be described in detail with reference to a timing chart in FIG. 32. The delay circuits 210 to 213 in FIG. 16 generate five different delay signals DLX0 to DLX4 having different delay times by the delay line 2102. The delay times of each of the delay signals DLX0 to DLX4 to the input clock signal PLLCK can arbitrarily be determined by changing the number of buffers 2101 through which the signal passes. However, the magnitude relationship thereof is needed to be ΔDLX0<ΔDLX1<ΔDLX2<ΔDLX3<ΔDLX4<$P_{PER}$/2.

When the control signal S[2:0] designates the duty ratio DUL % larger than 50%, the control signal CNTD[2:0] varies at the falling edge of the input clock signal PLLCK. In the chart in FIG. 32, the value of the control signal CNTD[2:0] is 0b001 in a term Tnx2. Therefore, the selector 2103 selects the delay signal DLX1 as the output signal PLLDLX according to the logic in FIG. 17. Further, the value of the control signal CNTD[2:0] is 0b010 in a term Tnx3. Therefore, the selector 2103 selects the delay signal DLX2 as the output signal PLLDLX according to the logic in FIG. 17.

Figure 33:
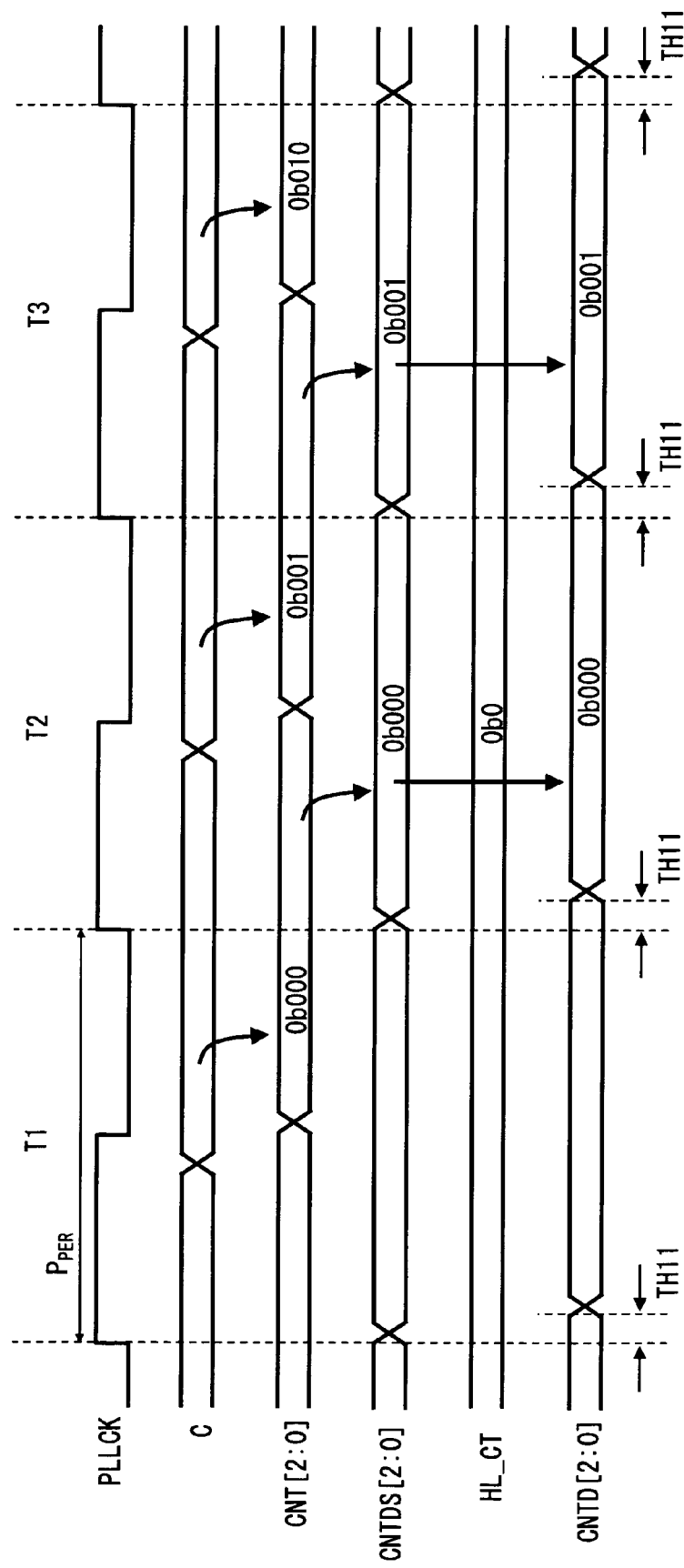
FIG. 33 is a timing chart showing a behavior of the duty correction circuit included in the clock duty changing apparatus according to the first embodiment of the invention.

Now, a behavior of the duty correction circuit 3 shown in FIG. 18 will be described in detail with reference to timing charts in FIGS. 33 and 34. FIG. 33 shows a case in which the duty ratio of the input clock signal PLLCK is decreased.

When the duty ratio of the input clock signal PLLCK is decreased, the value of the control signal HL_CT is 0b0. Therefore, the selector 33 shown in FIG. 19 selects the CNTDS[2:0] as the control signal CNTD[2:0] according to the logic in FIG. 19. In the term T2 in FIG. 33, the control circuit 30 determines the value of the new signal CNT[2:0] using the value of the CNTD[2:0] in the term T1 which is fed back and the value of the control signal C. Then the flip flop 31 latches the value of the CNT[2:0] determined in the term T2 at the rising edge of the input clock signal PLLCK in the next term T3 to output the latched value as the signal CNTDS [2:0] to the selector 33. Because the selector 33 selects the signal CNTDS[2:0], the selector 33 outputs the value of the CNTDS[2:0] which is delayed by TH1 to be renewed. TH11 is the time at which the signal passes through the selector 33.

Figure 34:
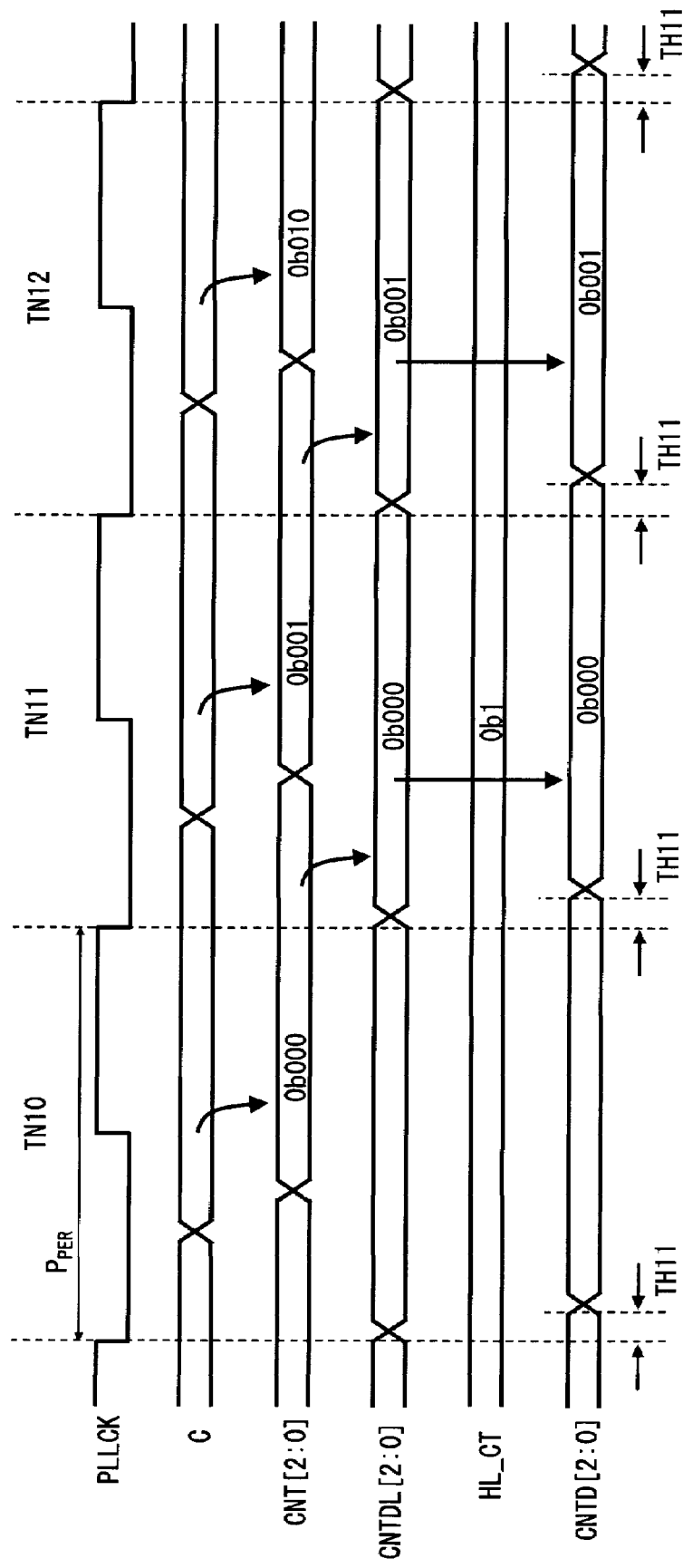
FIG. 34 is a timing chart showing a behavior of the duty correction circuit included in the clock duty changing apparatus according to the first embodiment of the invention.

FIG. 34 shows a case in which the duty ratio of the input clock signal PLLCK is increased. When the duty ratio of the input clock signal PLLCK is increased, the value of the control signal HL_CT is 0b1. Therefore, the selector 33 shown in FIG. 19 selects the CNTDL[2:0] as the control signal CNTD [2:0] according to the logic in FIG. 19. In the term TN11 in FIG. 34, the control circuit 30 determines the value of the new signal CNT[2:0] using the value of the CNTD[2:0] in a term TN10 which is fed back and the value of the control signal C. Then the flip flop 32 latches the value of the CNT[2:0] determined in the term T2 at the falling edge of the input clock signal PLLCK in the next term TN12 to output the latched value as the signal CNTDL[2:0] to the selector 33. Because the selector 33 selects the signal CNTDL[2:0], the selector 33 outputs the value of the CNTDL[2:0] which is delayed by TH11 to be renewed. TH11 is the time at which the signal passes through the selector 33.

Figure 35:
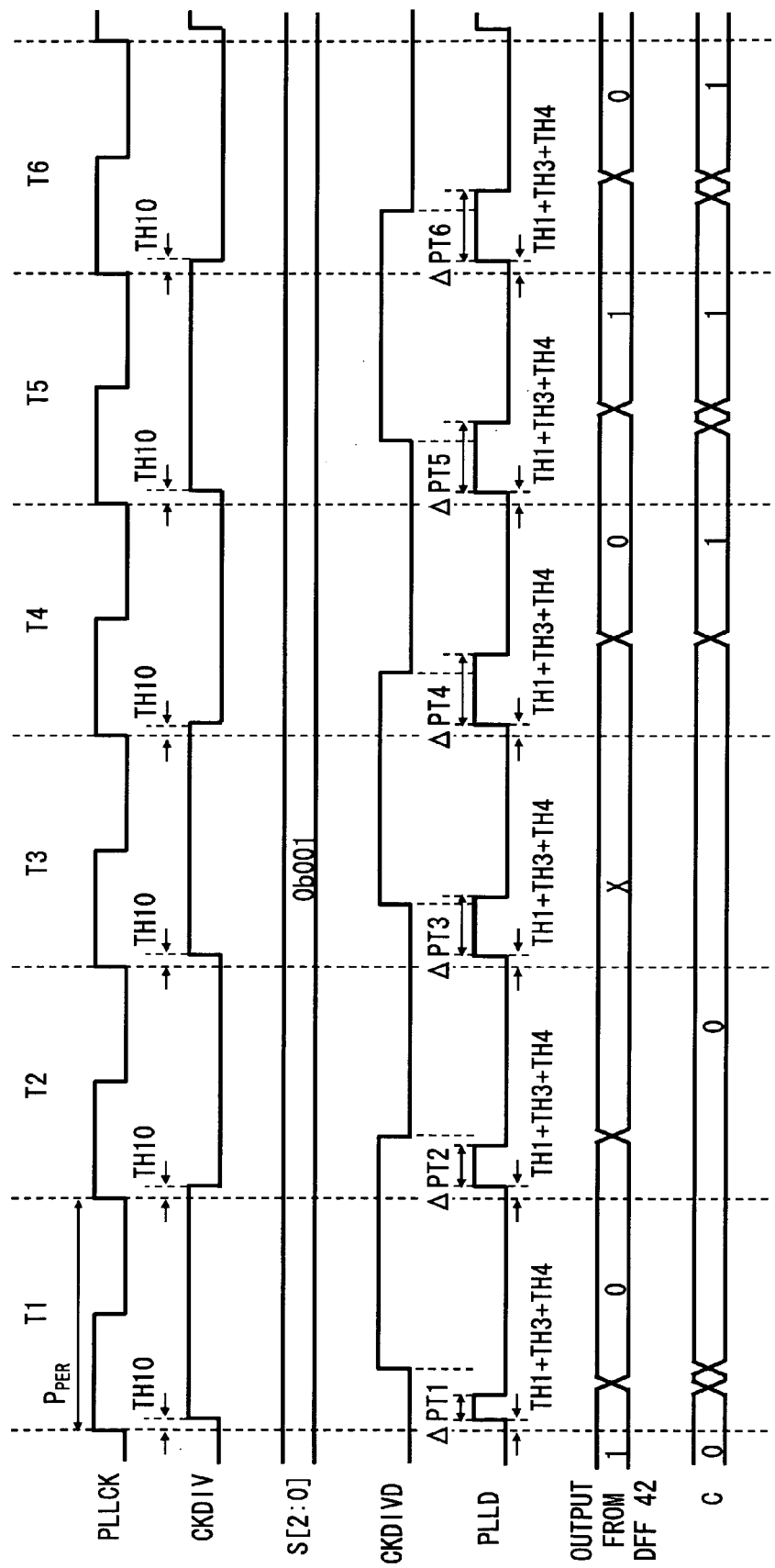
FIG. 35 is a timing chart showing a behavior of the duty comparison circuit included in the clock duty changing apparatus according to the first embodiment of the invention.

Now, the behavior of the duty comparison circuit 4 shown in FIG. 20 will be described in detail with reference to the timing charts shown in FIGS. 35 and 36. FIG. 35 shows a case in which the duty ratio of the input clock signal PLLCK is decreased. ΔCKDIVD, which corresponds to the time from the rising edge of the input clock signal PLLCK to the rising edge of the signal CKDIVD and the time from the rising edge of the input clock signal PLLCK to the falling edge of the signal CKDIVD, can be expressed by expression (87) below. As stated above, the DUS (%) is the duty ratio smaller than 50%. setup 42 is the setup time of the DFF 42. TH1 is the time passing through the AND circuit 24 in FIG. 5, TH3 is the time passing through the selector 25 in FIG. 5, and TH4 is the time passing through the selector 26 in FIG. 5.

$$\Delta CKDIVD = P_{PER} * DUS/100 - SETUP42 + TH1 + TH3 + TH4 \quad (87)$$

In the example in FIG. 35, the value of the control signal S[2:0] is 0b001, which means the set value of the duty ratio is 40%. In the terms T1 to T3 in FIG. 35, the High level periods ΔPt1 to ΔPt3 of the output clock signal PLLD is below 40% of the period $P_{PER}$ of the input clock signal PLLCK, which means the desired duty ratio is not achieved. Note that the DFF 42 in FIG. 20 latches the value of the output signal CKDIVD of the expected value generation section 41 at the falling edge of the output clock signal PLLD. Therefore, in the term T1, the DFF 42 latches the value before the output signal CKDIVD of the expected value generation section 41 is renewed. Further, in the term T2, hold error of the DFF 42 occurs because the hold time of the signal CKDIVD is not enough. Further, in the term T3, the setup error of the DFF 42 occurs because the setup time of the signal CKDIVD is not enough. Consequently, the value of the control signal C in the term T1 to T3 is 0b0.

In terms T4 to T6 in FIG. 35, the High level periods ΔPt4 to ΔPt6 of the output clock signal PLLD are regulated to 40% of the period $P_{PER}$ of the input clock signal PLLCK, which means the desired duty ratio is achieved. In such a case, the value of the output signal CKDIVD renewed by the expected value generation section 41 is latched by the DFF 42. Therefore, the value of the control signal C in the terms T4 to T6 is converged to 0b1. That is, it is possible to determine whether the duty ratio of the output clock signal PLLD is converged to the target value designated by the control signal S[2:0] by the logic value of the control signal C.

Figure 36:
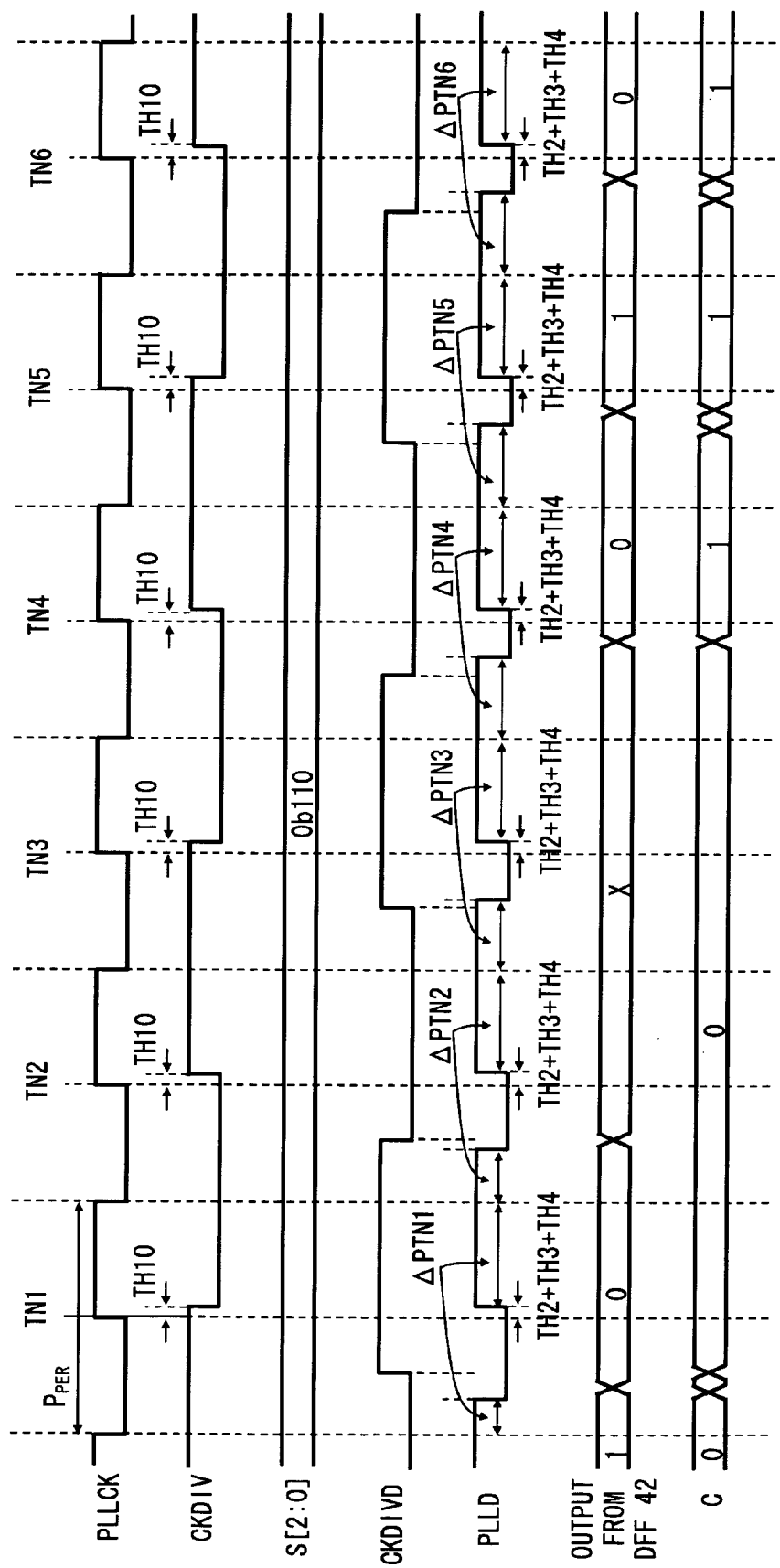
FIG. 36 is a timing chart showing a behavior of the duty comparison circuit included in the clock duty changing apparatus according to the first embodiment of the invention.

On the other hand, FIG. 36 shows a case in which the duty ratio of the input clock signal PLLCK is increased. ΔCKDIVD, which corresponds to the time from the rising edge of the input clock signal PLLCK to the rising edge of the signal CKDIVD and the time from the rising edge of the input clock signal PLLCK to the falling edge of the signal CKDIVD, can be expressed by expression (88) below. As stated above, the DUL (%) shows the duty ratio larger than 50%. setup 42 is the setup time of the DFF 42. TH2 is the time passing through the OR circuit 23 in FIG. 5, TH3 is the time passing through the selector 25 in FIG. 5, and TH4 is the time passing through the selector 26 in FIG. 5.

$$\Delta CKDIVD = P_{PER} * DUL/100 - SETUP42 + TH2 + TH3 + TH4 \quad (88)$$

In the example in FIG. 36, the value of the control signal S[2:0] is 0b110, which means the set value of the duty ratio is 65%. In the terms TN1 to TN3 in FIG. 36, the High level periods ΔPTN1 to ΔPTN3 of the output clock signal PLLD is below 65% of the period $P_{PER}$ of the input clock signal PLLCK, which means the desired duty ratio is not achieved. In such a case, in the term TN1, the DFF 42 latches the value before the output signal CKDIVD of the expected value generation section 41 is renewed. In the term TN2, the hold error occurs in the DFF 42 because the hold time of the signal CKDIVD is not enough. In the term T3, the setup error occurs in the DFF 42 because the setup time of the signal CKDIVD is not enough. Consequently, the value of the control signal C in the terms TN1 to TN3 is 0b0.

In the terms TN4 to TN6 in FIG. 36, the High level periods ΔPTN4 to ΔPTN6 of the output clock signal PLLD are regulated to 65% of the period $P_{PER}$ of the input clock signal PLLCK, which means the desired duty ratio is achieved. In this case, the DFF 42 latches the value of the output signal CKDIVD renewed by the expected value generation section 41. Therefore, the value of the control signal C in the terms TN4 to TN6 is converged to 0b1. Therefore, it is possible to determine whether the duty ratio of the output clock signal PLLD is converged to the target value designated by the control signal S[2:0] by the logic value of the control signal C.

Figure 37:
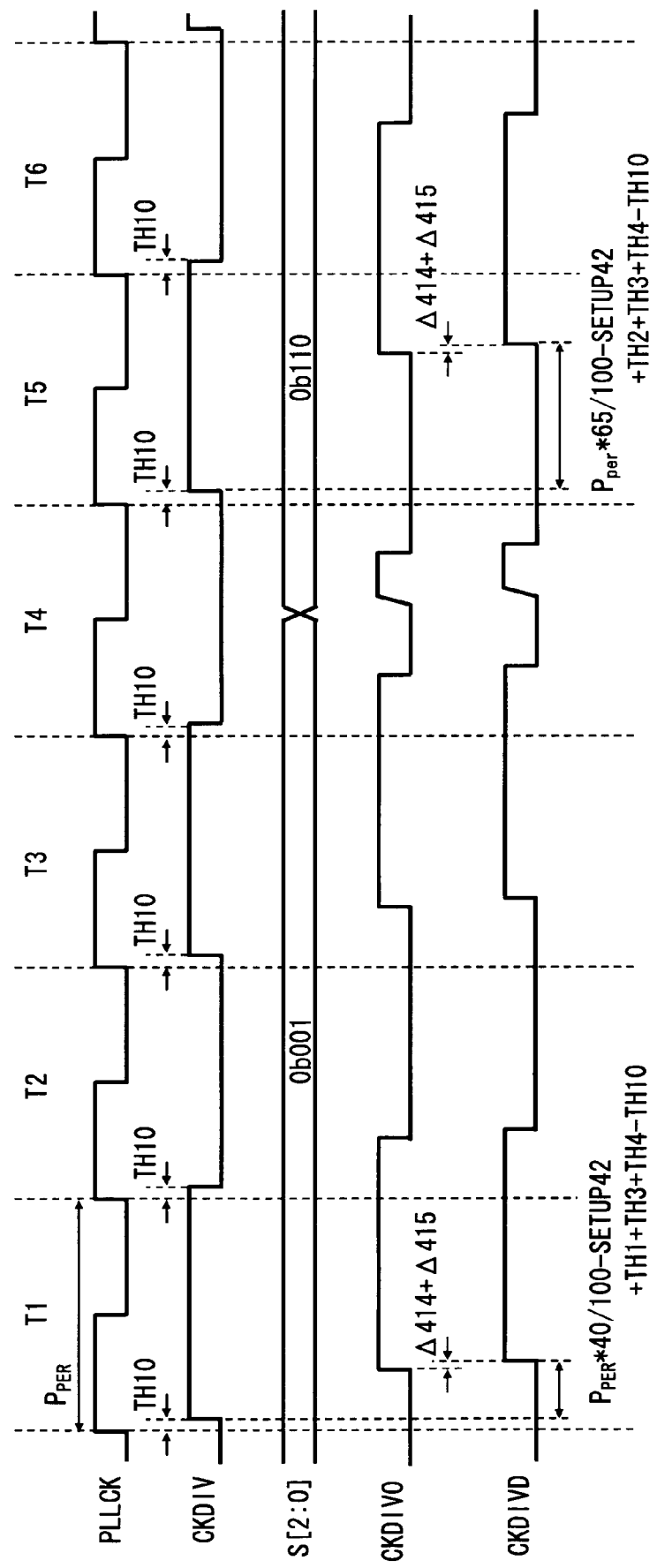
FIG. 37 is a timing chart showing a behavior of the expected value generation section included in the duty comparison circuit.

Now, a behavior of the expected value generation section 41 shown in FIG. 21 will be described with reference to a timing chart in FIG. 37. As stated above, the expected value generation section 41 delays the input signal CKDIV to output the delay signal CKDIVD. The delay time ΔCKDIV of the delay signal CKDIVD to the input signal CKDIV is shown in the expressions (17) and (18). In the example in FIG. 37, the value of the control signal S[2:0] in the terms T1 to T3 is 0b001, which means the set value of the duty ratio is 40%. Therefore, ΔCKDIV is regulated to the value having DUS (%) of 40 (%) in the expression (17). On the other hand, in the term T4, the value of the control signal S[2:0] is changed to 0b110, and the set value of the duty ratio is 65%. Therefore, in the terms T5 and T6, ΔCKDIV is regulated to the value having DUL (%) of 65 (%) in the expression (18).

Now, the behavior of the delay circuit 410 shown in FIG. 22 is described with reference to a timing chart in FIG. 38. As stated above, the delay circuit 410 delays the input signal CKDIV to output the delay signal CKDIVO. The delay time ΔCKDIVO of the delay signal CKDIVD to the input signal CKDIV is shown in the expressions (19) and (20). In the example in FIG. 38, the value of the control signal S[2:0] in the terms T1 to T3 is 0b001, which means the set value of the duty ratio is 40%. Therefore, ΔCKDIVO is regulated to the value having DUS (%) of 40 (%) in the expression (19). Specifically, the selector 418 selects the delay signal d2 as the output signal CKDIVO according to the logic shown in FIG. 23.

Figure 38:
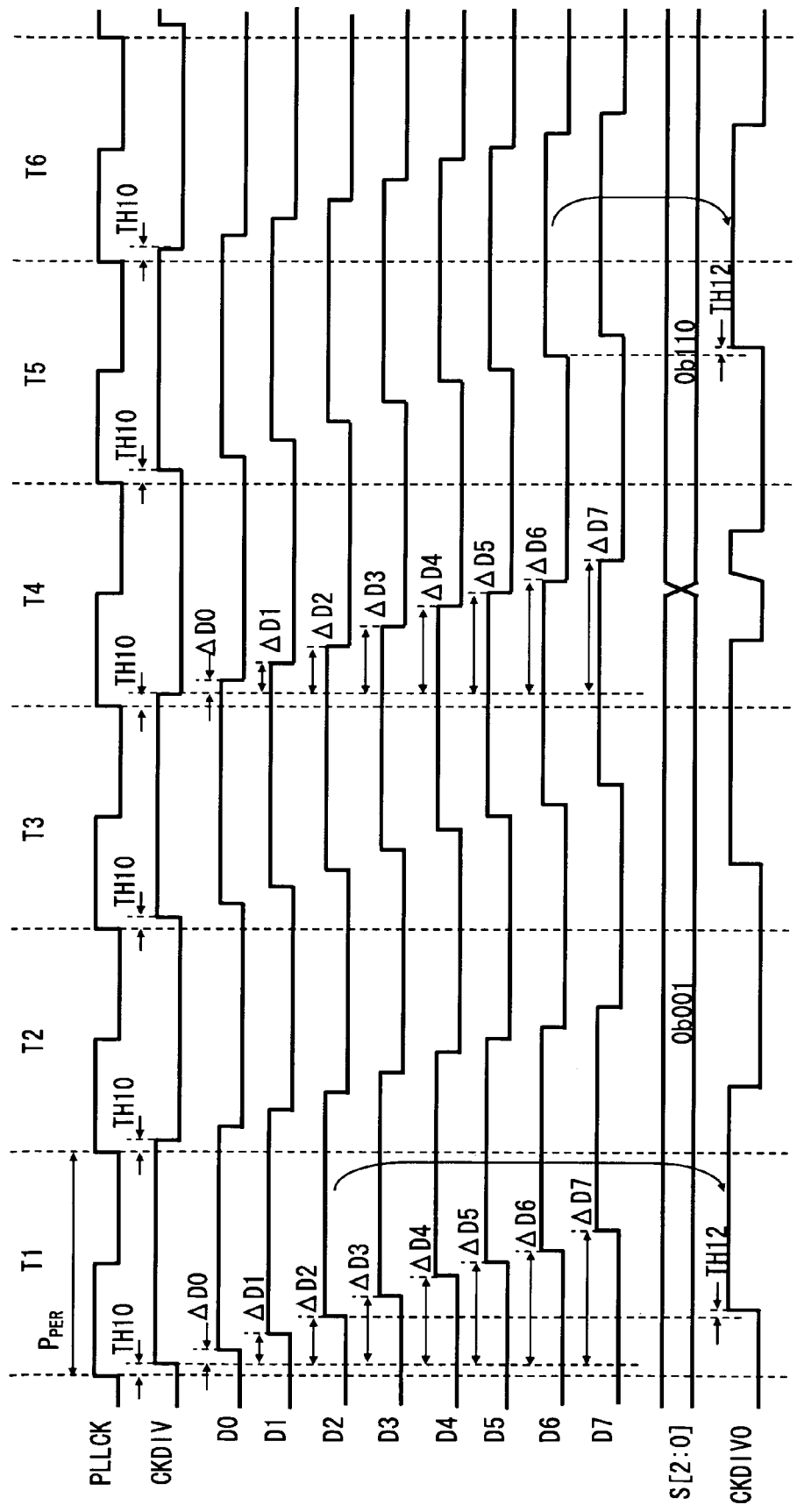
FIG. 38 is a timing chart showing a behavior of the delay circuit included in the expected value generation section.

On the other hand, in the term T4 in FIG. 38, the value of the control signal S[2:0] is changed to 0b110, which means the set value of the duty ratio is 65%. Therefore, in the terms T5 and T6, the ΔCKDIVO is regulated to the value having DUL (%) of 65 (%) in the expression (20). Specifically, the delay signal d6 is selected as the output signal CKDIVO according to the logic shown in FIG. 23.

As stated above, the clock duty changing apparatus 100 according to the first embodiment is configured as the circuit separated from the clock generation circuit such as the PLL circuit or the like, and the clock duty changing apparatus 100 is connected to an output means of the PLL circuit or the like, which makes it possible to regulate the duty ratio of the clock signal output from the PLL circuit or the like to the desired value. Therefore, the clock duty changing apparatus 100 is widely applicable regardless of the configuration of the PLL circuit.

Further, the clock duty changing apparatus 100 according to the first embodiment indicates the number of duty ratio that can be regulated by the bit width of the control signal S[2:0] input from the external device. Therefore, the number of duty ratio that can be regulated can arbitrarily be determined by the bit width of the control signal S[2:0]. The number of duty ratio that can be regulated can easily be changed by changing the bit width of the control signal S[2:0].

The specific configuration example in the first embodiment is configured by mainly using the delay line having buffer circuits connected in series (see FIGS. 12, 16, and 22). By configuring the clock duty changing apparatus 100 to have simple configuration as stated above, it is possible to easily change the circuit when the number or the value of the duty ratio regulated by the clock duty changing apparatus 100 is changed.

Further, in the clock duty changing apparatus 100 according to the first embodiment, the duty ratio and the expected value are sequentially compared when the duty ratio is changed. Therefore, it is possible to compensate the deviation of the duty ratio of the output clock signal PLLD due to the production tolerance and to reduce the mismatch between the duty ratio of the output clock signal PLLD and the target value of the duty ratio designated by the control signal S[2:0].

In the configuration example described above, the duty regulation circuit 2 has two delay selection circuits 20 and 21. However, the number of delay selection circuit can be one. In such a configuration, for example, the output line of the delay selection circuit may be divided into two and the divided lines may be input to the inverter 22 or the OR circuit 23. By having such a configuration, it is possible to reduce size of the circuit.

It is apparent that the present invention is not limited to the above embodiments, but may be modified and changed without departing from the scope and spirit of the invention.

What is claimed is:

1. A clock duty changing apparatus changing a duty ratio of an input clock signal with nearly 50% duty ratio to a target value being externally supplied and outputting the input clock signal thereinafter as an output signal, comprising:

a duty regulation circuit including a delay selection circuit and an operation circuit, the delay selection circuit being configured to generate a delay signal generated by delaying the input clock signal by delay time determined based on a first control signal and a second control signal, the first control signal being externally supplied to the apparatus in order to designate the target value, the second control signal being generated in the apparatus, the operation circuit being configured to generate the output clock signal by a logic operation using the delay signal and the input clock signal;

a duty comparison circuit determining whether or not the duty ratio of the output clock signal matches the target value; and a duty correction circuit generating the second control signal depending on the determination result made by the duty comparison circuit, the second control signal indicating a correction amount of the delay time given to the delay signal so that mismatch between the duty ratio of the output clock signal and the target value is reduced.

2. The clock duty changing apparatus according to claim 1, wherein the input clock signal is generated by a PLL circuit arranged externally to the clock duty changing apparatus.

3. The clock duty changing apparatus according to claim 1, further comprising an encoder generating a third control signal indicating whether the duty ratio is increased or decreased and a fourth control signal indicating a degree of increasing or decreasing in the duty ratio according to the first control signal, wherein the delay selection circuit delaying the input clock signal by the delay time determined according to the second control signal and the fourth control signal to output the delayed signal, the operation circuit comprising:

an OR circuit operating a logic sum of the delay signal output from the delay selection circuit and the input clock signal;

an AND circuit operating a logic multiplication of the delay signal output from the delay selection circuit or the signal obtained by inverting the delay signal and the input clock signal; and a selector circuit receiving output signals from the OR circuit and the AND circuit, the selector circuit selecting the output signal of the OR circuit as the output clock signal when the third control signal indicates increase in the duty ratio and selecting the output signal of the AND circuit as the output clock signal when the third control signal indicates decrease in the duty ratio.

4. The clock duty regulation circuit according to claim 3, wherein the delay selection circuit comprises:

a delay line having a plurality of buffer circuits connected in series, and a selector selecting one signal from a plurality of signals having different delay times output from the delay line as the delay signal according to the second control signal and the fourth control signal.

5. The clock duty regulation circuit according to claim 3, wherein the first control signal includes a first bit group of at least one bit indicating whether the duty ratio is increased or decreased and a second bit group of at least one bit indicating the degree of increase or decrease in the duty ratio, and the encoder generates the third control signal based on the first bit group and the fourth control signal based on the second bit group.

6. The clock duty regulation circuit according to claim 3, wherein the delay selection circuit includes a first delay selection circuit and a second delay selection circuit delaying the input clock signal by the delay time determined according to the second control signal and the fourth control signal to output the delayed signal, the OR circuit operates the logic sum of the delay signal output from the first delay selection circuit and the input clock signal, and the AND circuit operates the logic multiplication of the delay signal output from the second delay selection circuit or the signal obtained by inverting the delay signal and the input clock signal.

* * * * *